United States Patent
Nagatsuka

(10) Patent No.: US 7,332,936 B2
(45) Date of Patent: Feb. 19, 2008

(54) SEMICONDUCTOR CIRCUIT, DISPLAY DEVICE, ELECTRONIC APPARATUS

(75) Inventor: Shuhei Nagatsuka, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 63 days.

(21) Appl. No.: 11/287,957

(22) Filed: Nov. 28, 2005

(65) Prior Publication Data

US 2006/0214901 A1    Sep. 28, 2006

(30) Foreign Application Priority Data

Dec. 3, 2004    (JP)    ............... 2004-351793

(51) Int. Cl.
    *H03K 19/00*    (2006.01)

(52) U.S. Cl. .............. 326/93; 326/46; 326/83; 345/98

(58) Field of Classification Search .......... 326/46, 326/93–98, 82, 83, 86; 345/98, 100, 204, 345/205

See application file for complete search history.

(56) References Cited

U.S. PATENT DOCUMENTS

| | | | |
|---|---|---|---|
| 4,625,241 A | 11/1986 | Ohzeki | |
| 4,702,560 A | 10/1987 | Endo et al. | |
| 5,815,129 A * | 9/1998 | Jung | 345/93 |
| 6,232,798 B1 | 5/2001 | Coulman et al. | |
| 6,306,694 B1 | 10/2001 | Yamazaki et al. | |
| 6,396,470 B1 | 5/2002 | Zhang et al. | |
| 6,462,596 B1 | 10/2002 | Varma | |
| 6,989,805 B2 | 1/2006 | Inukai | |
| 7,006,068 B2 * | 2/2006 | Haga | 345/98 |
| 7,019,726 B2 * | 3/2006 | Yokoyama | 345/98 |
| 2001/0054999 A1 | 12/2001 | Azami | |
| 2002/0158828 A1 | 10/2002 | Isami et al. | |
| 2003/0012330 A1 | 1/2003 | Osame | 377/2 |
| 2003/0063079 A1 * | 4/2003 | Abe et al. | 345/204 |
| 2004/0150611 A1 * | 8/2004 | Tanaka | 345/100 |
| 2004/0155698 A1 | 8/2004 | Kimura | |
| 2005/0205880 A1 | 9/2005 | Anzai et al. | |

FOREIGN PATENT DOCUMENTS

| | | |
|---|---|---|
| JP | 62-230214 | 10/1987 |
| JP | 08-161896 | 6/1996 |
| JP | 2000-91896 | 3/2000 |

* cited by examiner

*Primary Examiner*—Don Le
(74) *Attorney, Agent, or Firm*—Cook, Alex, McFarron, Manzo, Cummings & Mehler, Ltd.

(57) ABSTRACT

To provide a semiconductor circuit having D flip-flops, a display device and an electronic apparatus having the display device, in the invention, the number of transistors is reduced by using 2 n-channel transistors and 2 p-channel transistors instead of using 2 conventional clocked inverters that have a total of 8 transistors in D flip-flops.

42 Claims, 20 Drawing Sheets

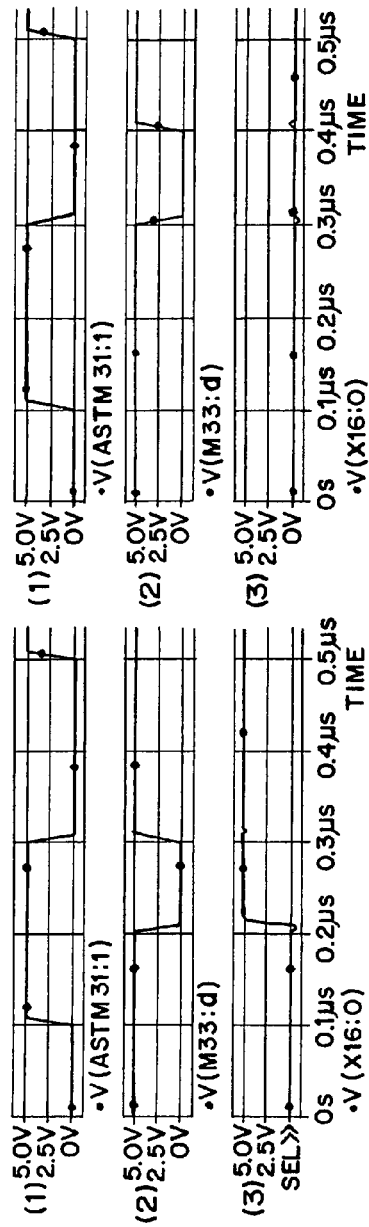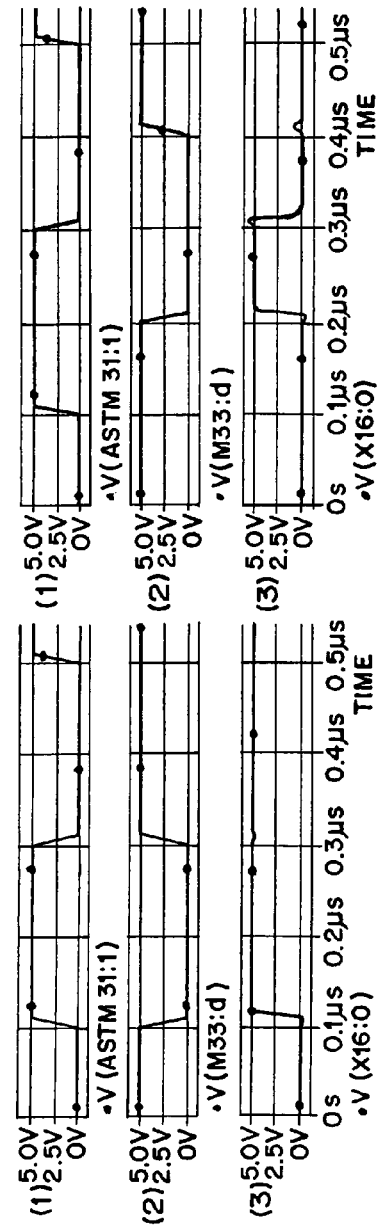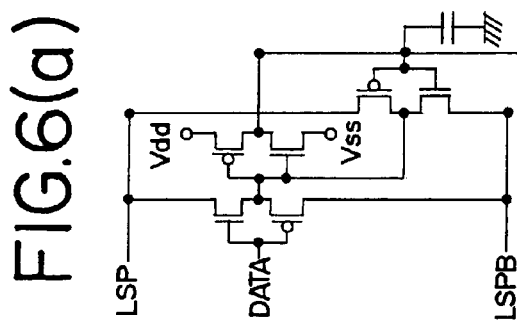

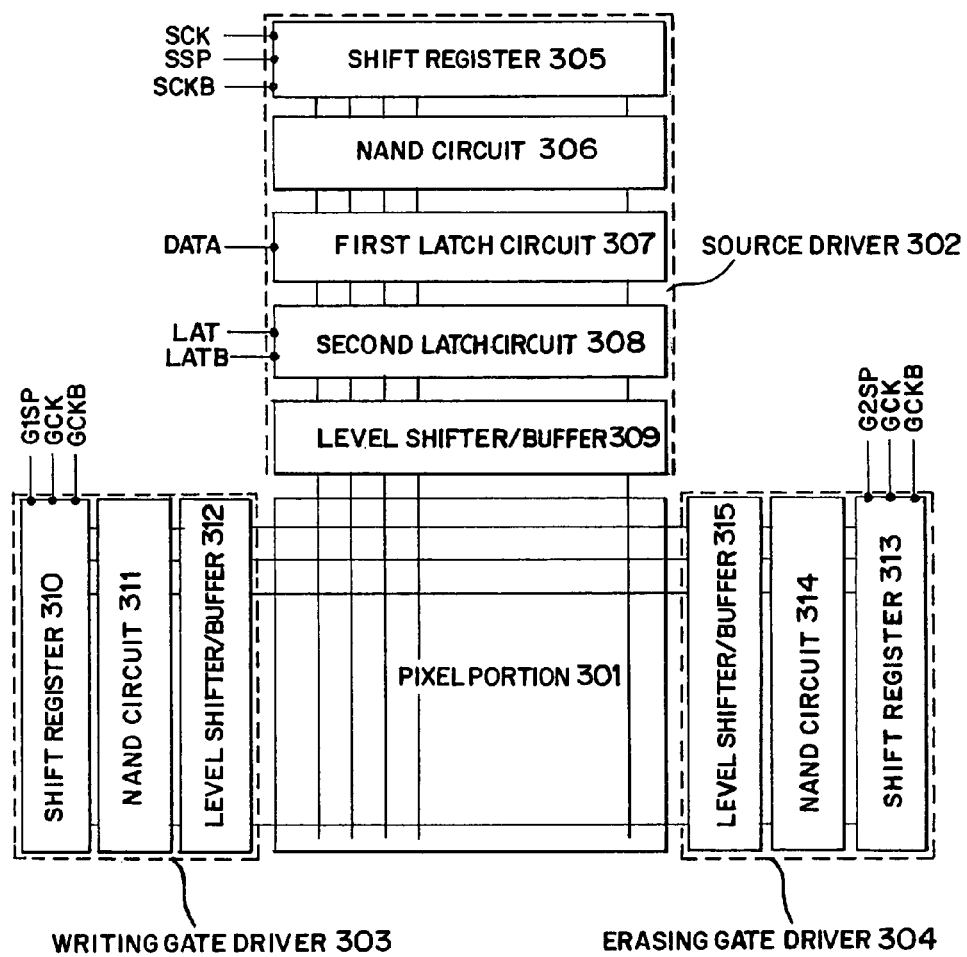

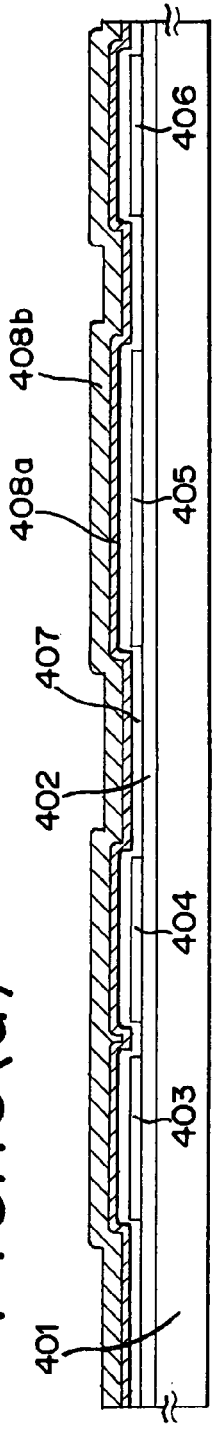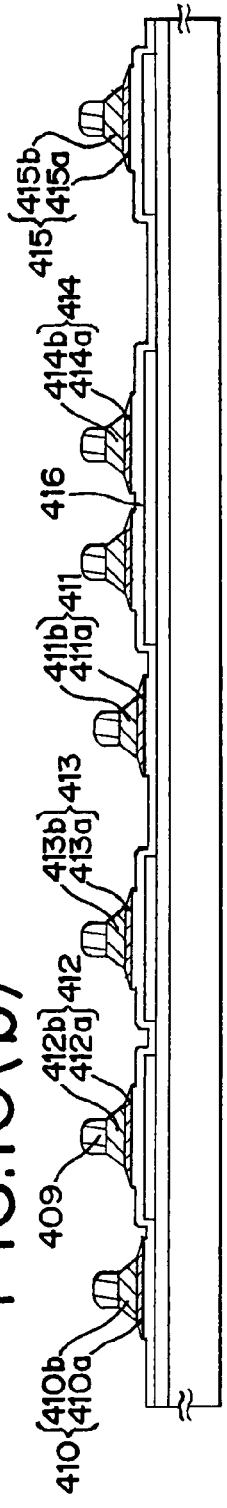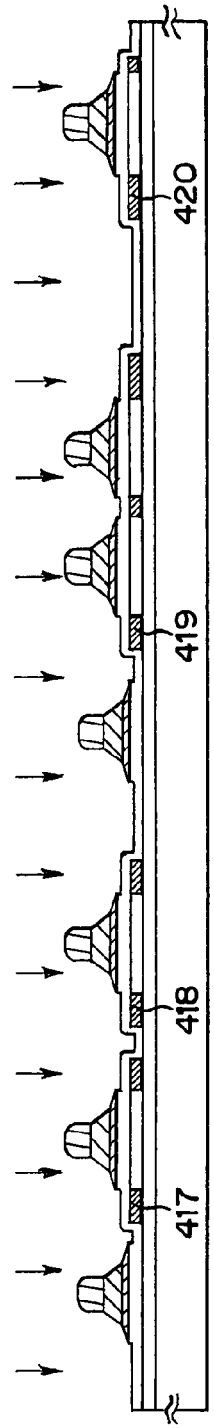
FIG.10(a)
FIG.10(b)
FIG.10(c)

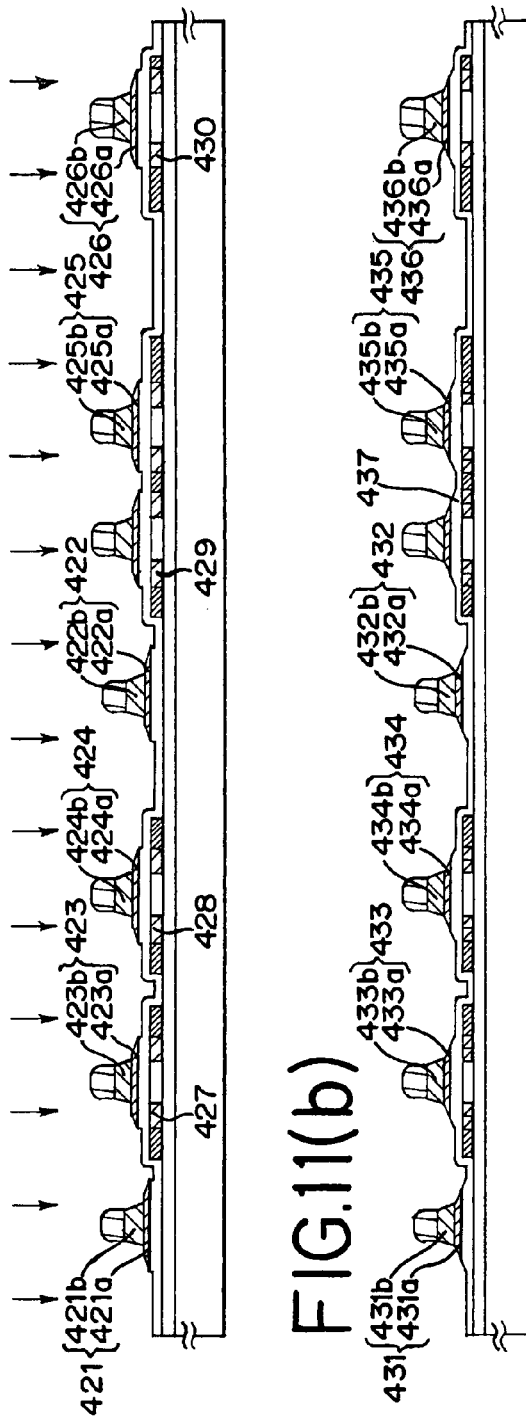

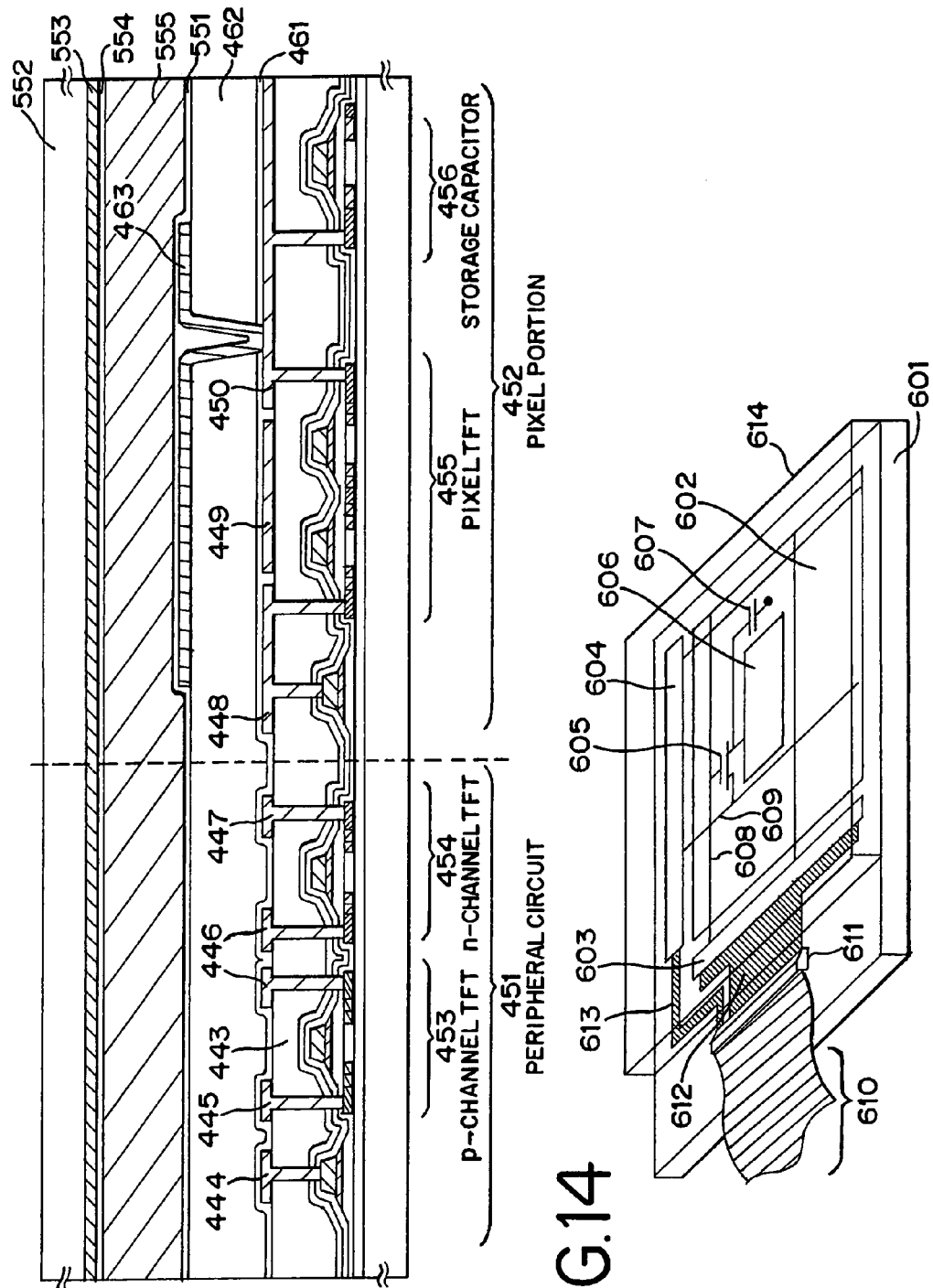

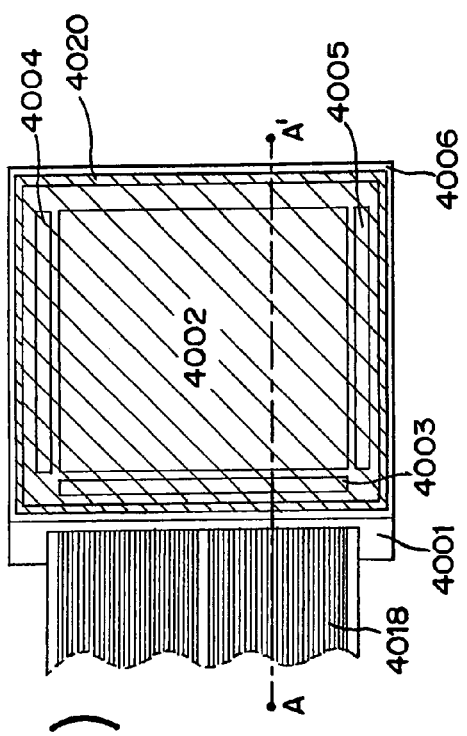
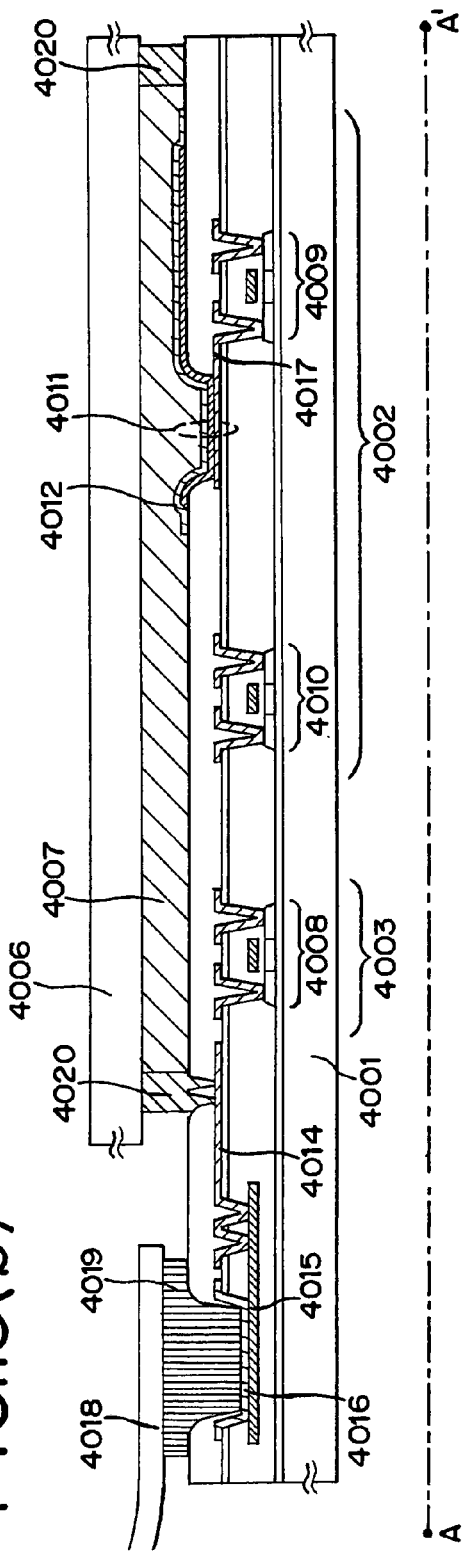
FIG.15(a)
FIG.15(b)

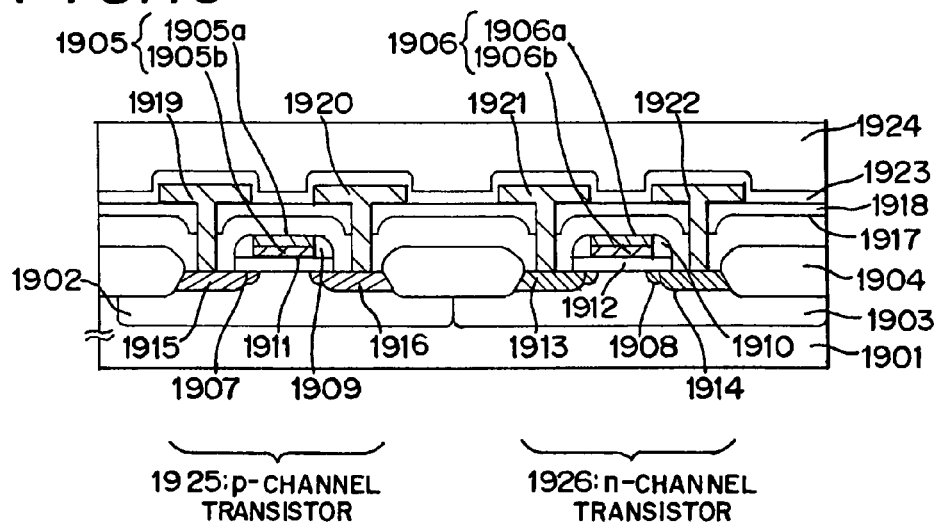
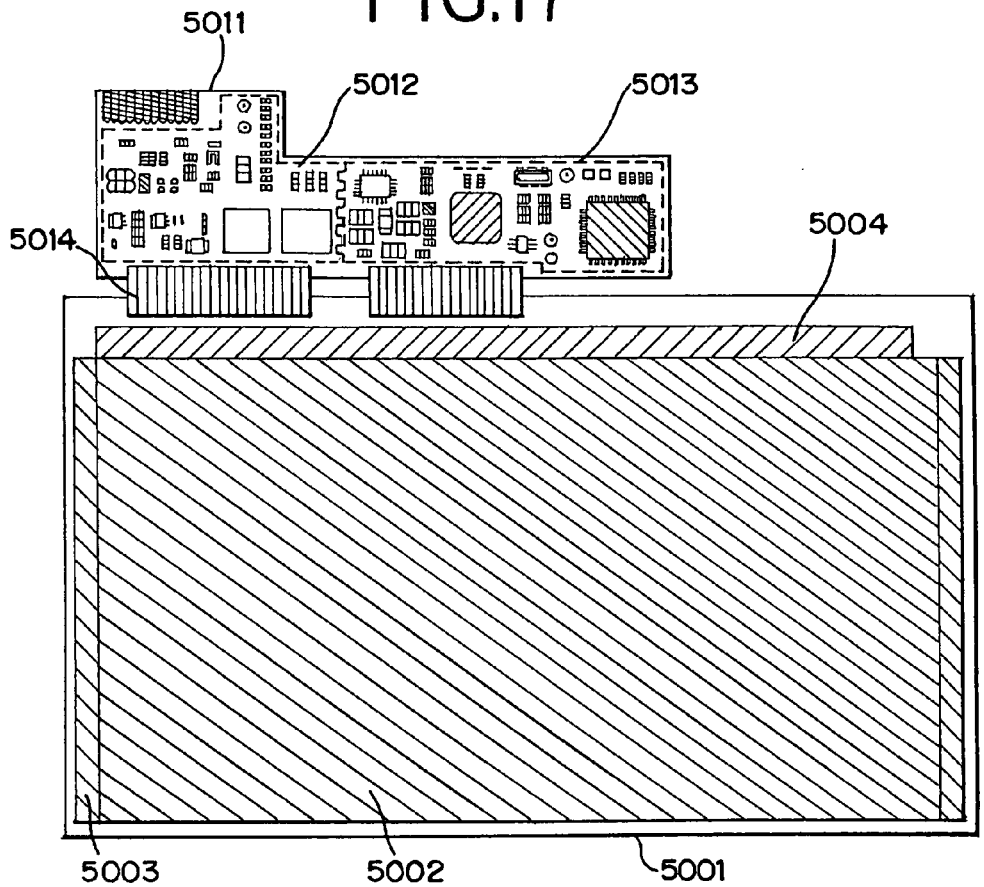

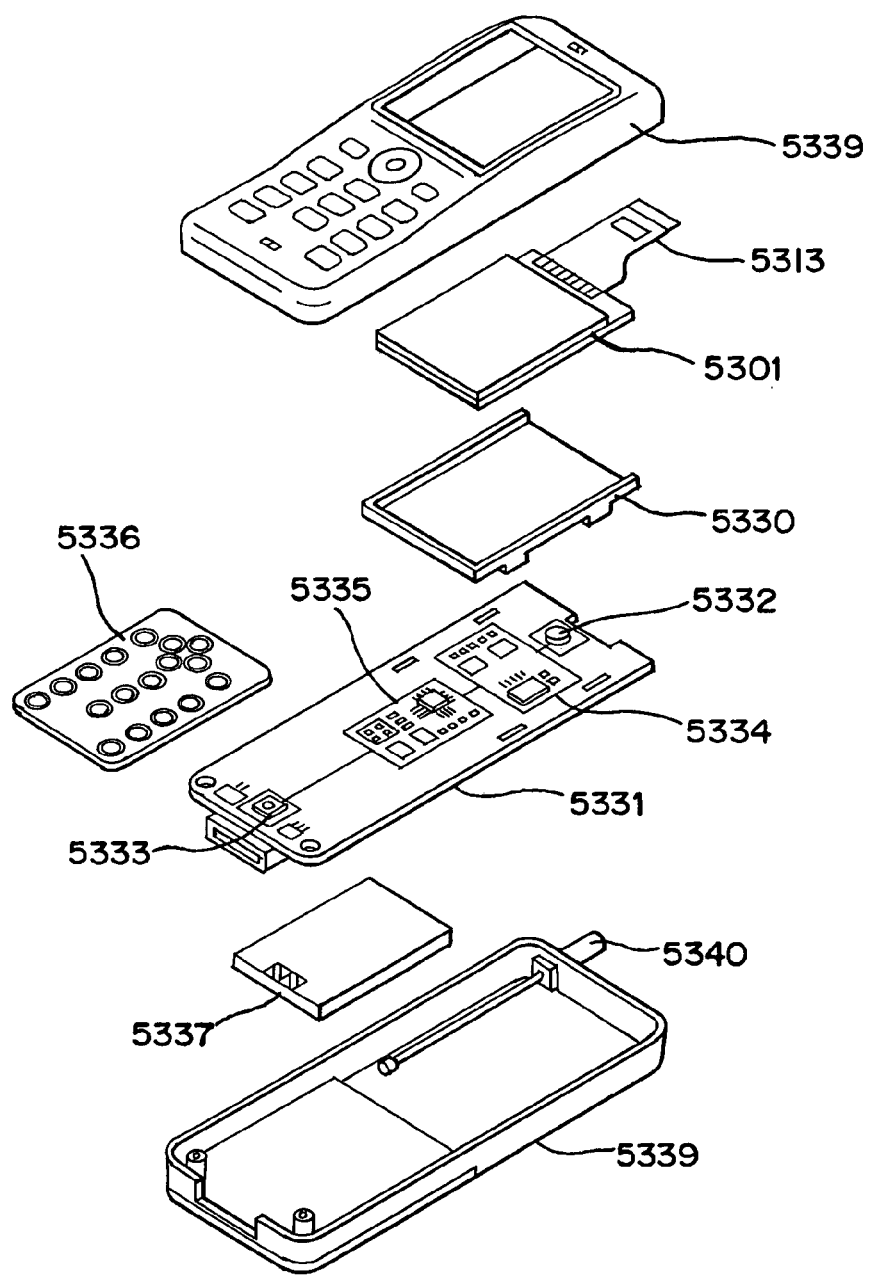

SEMICONDUCTOR CIRCUIT, DISPLAY DEVICE, ELECTRONIC APPARATUS

FIELD OF THE INVENTION

The present invention relates to a semiconductor circuit. In particular, the invention relates to a semiconductor circuit configured with transistors. In addition, the invention relates to a display device having the semiconductor circuit, and an electronic apparatus having the display device.

Note that the semiconductor circuit herein means all circuits that can function by utilizing the semiconductor characteristics.

BACKGROUND OF THE INVENTION

As a driver circuit of a display device, a semiconductor circuit that is inputted with signals for controlling the operation timing of transistors is used for various semiconductor devices.

Note that the semiconductor device in this specification means all devices that can function by utilizing the semiconductor characteristics, and all of electronic optical devices and electronic apparatuses fall within the category of the semiconductor device.

FIG. 23 shows a configuration example of a conventional semiconductor circuit that constitutes a shift register circuit or a latch circuit (see Patent Document 1, for example). The semiconductor circuit shown in FIG. 23 is constructed of a first clocked inverter CKINV1, a second clocked inverter CKINV2, and an inverter circuit INV.

An input terminal of the first clocked inverter CKINV1 is inputted with an input signal IN from outside, and an output terminal of the CKINV1 is connected to an input terminal of the inverter INV and an output terminal of the second clocked inverter CKINV2. An input terminal of the second clocked inverter CKINV2 is connected to an output terminal of the inverter INV.

Upon input of an input signal IN into the input terminal, an output signal OUT1 is outputted from the output terminal in synchronization with a timing control signal TP and an inverted timing control signal TPB obtained by inverting the timing control signal TP, which have been inputted to each of the first clocked inverter CKINV1 and the second clocked inverter CKINV2.

FIG. 24 shows a circuit diagram where transistors are used for illustrating the first clocked inverter CKINV1, the second clocked inverter CKINV2 and the inverter circuit INV that constitute a semiconductor circuit having the configuration shown in FIG. 23. In the semiconductor circuit shown in FIG. 24, a total of 10 transistors are used: 4 transistors for the first clocked inverter CKINV1, 4 transistors for the second clocked inverter CKINV2, and 2 transistors for the inverter INV.

A shift register circuit or a latch circuit of a driver circuit are provided with multiple stages of the semiconductor circuit in FIG. 24, which respectively output signals by shifting input signals by a half cycle, and sample and hold inputted signals.

Patent Document 1—Japanese Patent Laid-Open No. Hei 8-161896

In the configuration of the conventional semiconductor circuit in FIG. 23 and FIG. 24 that constitutes a shift register circuit or a latch circuit, 2 clocked inverters and one inverter are used, and a total of 10 transistors are used as shown in FIG. 24.

Since the aforementioned semiconductor circuit uses multiple stages to construct a shift register circuit or a latch circuit, the number of transistors for manufacturing the shift register circuit or the latch circuit is increased in proportion to the number of transistors used in the semiconductor circuit. Therefore, in an active matrix display device, the number of transistors that is increased in accordance with the increased columns and rows of a pixel portion leads to an increase in the layout area of a driver circuit. In addition, such a problem is posed that the yield is decreased resulting from variations of transistors in accordance with the increased number of transistors for constructing the circuit.

As set forth above, a semiconductor circuit that constitutes a shift register circuit or a latch circuit has problems presently on the configuration such as an increased layout area and a decreased yield. The invention is made in view of the foregoing problems, and therefore the invention provides a semiconductor circuit, a display device, and an electronic apparatus having the display device for solving the aforementioned problems.

SUMMARY OF THE INVENTION

In order to solve the aforementioned problems, the invention provides a semiconductor circuit where the number of transistors can be reduced by using n-channel transistors and p-channel transistors instead of using the 2 clocked inverters that have a total of 8 transistors and thus occupy the semiconductor circuit in FIGS. 23 and 24.

More specifically, a semiconductor circuit of the invention is configured to have: a first n-channel transistor, a first p-channel transistor, a second n-channel transistor, a second p-channel transistor, and an inverter circuit, a gate terminal of the first n-channel transistor and a gate terminal of the first p-channel transistor to which a first input signal is inputted; a first terminal of the first n-channel transistor to which a timing control signal is inputted; a first terminal of the first p-channel transistor to which an inverted timing control signal is inputted; a second terminal of the first n-channel transistor and a second terminal of the first p-channel transistor which are electrically connected to each other; the second terminals of the first n-channel transistor and the first p-channel transistor are electrically connected to an input terminal of the inverter circuit; a gate terminal of the second n-channel transistor and a gate terminal of the second p-channel transistor to which a second signal that is outputted from an output terminal of the inverter circuit is inputted; a first terminal of the second p-channel transistor to which the timing control signal is inputted; a first terminal of the second n-channel transistor to which the inverted timing control signal is inputted; a second terminal of the second n-channel transistor and a second terminal of the second p-channel transistor which are electrically connected to each other; and the second terminals of the second n-channel transistor and the second p-channel transistor are electrically connected to the input terminal of the inverter circuit.

Another semiconductor circuit of the invention is configured to have: a first n-channel transistor, a first p-channel transistor, a second n-channel transistor, a second p-channel transistor, and an inverter circuit, a gate terminal of the first n-channel transistor and a gate terminal of the first p-channel transistor to which a first input signal is inputted; a first terminal of the first p-channel transistor to which a timing control signal is inputted; a first terminal of the first n-channel transistor to which an inverted timing control signal is inputted; a second terminal of the first n-channel transistor and a second terminal of the first p-channel transistor which are electrically connected to each other; the second terminals of the first n-channel transistor and the first p-channel transistor are electrically connected to an input terminal of the inverter circuit; a gate terminal of the second n-channel transistor and a gate terminal of the second p-channel transistor to which a second signal that is outputted from an output terminal of the inverter circuit is inputted; a first terminal of the second n-channel transistor to which the timing control signal is inputted; a first terminal of the second p-channel transistor to which the inverted timing control signal is inputted; a second terminal of the second n-channel transistor and a second terminal of the second p-channel transistor which are electrically connected to each other; and the second terminals of the second n-channel transistor and the second p-channel transistor are electrically connected to the input terminal of the inverter circuit.

The timing control signal of the invention may be a latch signal, and the inverted timing control signal may constitute an inverted latch signal.

Alternatively, the timing control signal of the invention may be a clock signal, and the inverted timing control signal may constitute an inverted clock signal.

Another semiconductor circuit of the invention constitutes: a first n-channel transistor, a first p-channel transistor, a second n-channel transistor, a second p-channel transistor, a first inverter circuit, a third n-channel transistor, a third p-channel transistor, a fourth n-channel transistor, a fourth p-channel transistor, and a second inverter circuit, a gate terminal of the first n-channel transistor and a gate terminal of the first p-channel transistor to which a first input signal is inputted; a first terminal of the first n-channel transistor to which a clock signal is inputted; a first terminal of the first p-channel transistor to which an inverted clock signal is inputted; a second terminal of the first n-channel transistor and a second terminal of the first p-channel transistor which are electrically connected to each other; the second terminal of the first n-channel transistor and the second terminal of the first p-channel transistor are electrically connected to an input terminal of the first inverter circuit; a gate terminal of the second n-channel transistor and a gate terminal of the second p-channel transistor to which a second signal that is outputted from an output terminal of the first inverter circuit is inputted; a first terminal of the second p-channel transistor to which the clock signal is inputted; a first terminal of the second n-channel transistor to which the inverted clock signal is inputted; a second terminal of the second n-channel transistor and a second terminal of the second p-channel transistor which are electrically connected to each other; the second terminals of the second n-channel transistor and the second p-channel transistor are electrically connected to the input terminal of the first inverter circuit; a gate terminal of the third n-channel transistor and a gate terminal of the third p-channel transistor to which the second input signal is inputted; a first terminal of the third p-channel transistor to which the clock signal is inputted; a first terminal of the third n-channel transistor to which the inverted clock signal is inputted; a second terminal of the third n-channel transistor and a second terminal of the third p-channel transistor which are electrically connected to each other; the second terminals of the third n-channel transistor and the third p-channel transistor are electrically connected to an input terminal of the second inverter circuit; a gate terminal of the fourth n-channel transistor and a gate terminal of the fourth p-channel transistor to which a third signal that is outputted from an output terminal of the second inverter circuit is inputted; a first terminal of the fourth n-channel transistor to which the clock signal is inputted; a first terminal of the fourth p-channel transistor to which the inverted clock signal is inputted; a second terminal of the fourth n-channel transistor and a second terminal of the fourth p-channel transistor electrically connected to each other; and the second terminal of the fourth n-channel transistor and the second terminal of the fourth p-channel transistor are electrically connected to the input terminal of the second inverter circuit.

Another semiconductor circuit of the invention constitutes: a first n-channel transistor, a first p-channel transistor, a second n-channel transistor, a second p-channel transistor, a first inverter circuit, a third n-channel transistor, a third p-channel transistor, a fourth n-channel transistor, a fourth p-channel transistor, and a second inverter circuit, a gate terminal of first n-channel transistor and a gate terminal of the first p-channel transistor to which a first input signal is inputted; a first terminal of the first p-channel transistor to which a clock signal is inputted; a first terminal of the first n-channel transistor to which an inverted clock signal is inputted; a second terminal of the first n-channel transistor and a second terminal of the first p-channel transistor which are electrically connected to each other; the second terminals of the first n-channel transistor and the first p-channel transistor are electrically connected to an input terminal of the first inverter circuit; a gate terminal of the second n-channel transistor and a gate terminal of the second p-channel transistor to which a second signal that is outputted from an output terminal of the first inverter circuit is inputted; a first terminal of the second n-channel transistor to which the clock signal is inputted; a first terminal of the second p-channel transistor to which the inverted clock signal is inputted; a second terminal of the second n-channel transistor and a second terminal of the second p-channel transistor which are electrically connected to each other; the second terminals of the second n-channel transistor and the second p-channel transistor are electrically connected to the input terminal of the first inverter circuit; a gate terminal of the third n-channel transistor and a gate terminal of the third p-channel transistor to which the second input signal is inputted; a first terminal of the third n-channel transistor to which the clock signal is inputted; a first terminal of the third p-channel transistor to which the inverted clock signal is inputted; a second terminal of the third n-channel transistor and a second terminal of the third p-channel transistor which are electrically connected to each other; the second terminals of the third n-channel transistor and the third p-channel transistor are electrically connected to an input terminal of the second inverter circuit; a gate terminal of the fourth n-channel transistor and a gate terminal of the fourth p-channel transistor to which a third signal that is outputted from an output terminal of the second inverter circuit is inputted; a first terminal of the fourth p-channel transistor to which the clock signal is inputted; a first terminal of the fourth n-channel transistor to which the inverted clock signal is inputted; a second terminal of the fourth n-channel transistor and a second terminal of the fourth p-channel transistor electrically connected to each other; and the second terminals of the fourth n-channel transistor and the fourth p-channel transistor are electrically connected to the input terminal of the second inverter circuit.

The n-channel transistors and the p-channel transistors of the invention may constitute thin film transistors formed over a glass substrate.

Alternatively, the n-channel transistors and the p-channel transistors of the invention may be formed over a single crystalline substrate.

In addition, the invention can provide a display device where the number of transistors can be reduced by using n-channel transistors and p-channel transistors instead of using 2 clocked inverters that have a total of 8 transistors and thus occupy the semiconductor circuit in FIGS. 23 and 24.

More specifically, a display device of the invention includes: a gate driver, a source driver, and a pixel portion connected to the source driver and the gate driver. The source driver includes a shift register circuit and a latch circuit; the gate driver includes a shift register circuit; each of the shift register circuit and the latch circuit of the source driver and the shift register circuit of the gate driver has a semiconductor circuit having a first n-channel transistor, a first p-channel transistor, a second n-channel transistor, a second p-channel transistor, and an inverter circuit. The semiconductor circuit constitutes a gate terminal of the first n-channel transistor and a gate terminal of the first p-channel transistor to which a first input signal is inputted; a first terminal of the first n-channel transistor to which a timing control signal is inputted; a first terminal of the first p-channel transistor to which an inverted timing control signal is inputted; a second terminal of the first n-channel transistor and a second terminal of the first p-channel transistor which are electrically connected to each other; the second terminals of the first n-channel transistor and the first p-channel transistor are electrically connected to an input terminal of the inverter circuit; a gate terminal of the second n-channel transistor and a gate terminal of the second p-channel transistor to which a second signal that is outputted from an output terminal of the inverter circuit is inputted; a first terminal of the second p-channel transistor to which the timing control signal is inputted; a first terminal of the second n-channel transistor to which the inverted timing control signal is inputted; a second terminal of the second n-channel transistor and a second terminal of the second p-channel transistor which are electrically connected to each other; and the second terminals of the second n-channel transistor and the second p-channel transistor are electrically connected to the input terminal of the inverter circuit.

Another display device of the invention includes: a gate driver, a source driver, and a pixel portion connected to the source driver and the gate driver. The source driver includes a shift register circuit and a latch circuit; the gate driver includes a shift register circuit; each of the shift register circuit of the source driver and the shift register circuit of the gate driver has a semiconductor circuit having a first n-channel transistor, a first p-channel transistor, a second n-channel transistor, a second p-channel transistor, and an inverter circuit. The semiconductor circuit constitutes a gate terminal of the first n-channel transistor and a gate terminal of the first p-channel transistor to which a first input signal is inputted; a first terminal of the first p-channel transistor to which a timing control signal is inputted; a first terminal of the first n-channel transistor to which an inverted timing control signal is inputted; a second terminal of the first n-channel transistor and a second terminal of the first p-channel transistor which are electrically connected to each other; the second terminals of the first n-channel transistor and the first p-channel transistor are electrically connected to an input terminal of the inverter circuit; a gate terminal of the second n-channel transistor and a gate terminal of the second p-channel transistor to which a second signal that is outputted from an output terminal of the inverter circuit is inputted; a first terminal of the second n-channel transistor to which the timing control signal is inputted; a first terminal of the second p-channel transistor to which the inverted timing control signal is inputted; a second terminal of the second n-channel transistor and a second terminal of the second p-channel transistor which are electrically connected to each other; and the second terminals of the second n-channel transistor and the second p-channel transistor are electrically connected to the input terminal of the inverter circuit.

Another display device of the invention includes: a gate driver, a source driver, and a pixel portion connected to the source driver and the gate driver. The source driver includes a shift register circuit and a latch circuit; the gate driver includes a shift register circuit; each of the shift register circuit of the source driver and the shift register circuit of the gate driver has multiple stages of semiconductor circuits each having a first n-channel transistor, a first p-channel transistor, a second n-channel transistor, a second p-channel transistor, a first inverter circuit, a third n-channel transistor, a third p-channel transistor, a fourth n-channel transistor, a fourth p-channel transistor, and a second inverter circuit. Each of the semiconductor circuits constitutes a gate terminal of the second n-channel transistor and a gate terminal of the second p-channel transistor to which a second signal that is outputted from an output terminal of the first inverter circuit is inputted; a first terminal of the second p-channel transistor to which the clock signal is inputted; a first terminal of the second n-channel transistor to which the inverted timing control signal is inputted; a second terminal of the second n-channel transistor and a second terminal of the second p-channel transistor which are electrically connected to each other; the second terminals of the second n-channel transistor and the second p-channel transistor are electrically connected to an input terminal of the first inverter circuit; a gate terminal of the third n-channel transistor and a gate terminal of the third p-channel transistor to which the second input signal is inputted; a first terminal of the third p-channel transistor to which the clock signal is inputted; a first terminal of the third n-channel transistor to which the inverted clock signal is inputted; a second terminal of the third n-channel transistor and a second terminal of the third p-channel transistor which are electrically connected to each other; the second terminals of the third n-channel transistor and the third p-channel transistor are electrically connected to an input terminal of the second inverter circuit; a gate terminal of the fourth n-channel transistor and the fourth p-channel transistor to which a third signal that is outputted from an output terminal of the second inverter circuit is inputted; a first terminal of the fourth n-channel transistor to which the clock signal is inputted; a first terminal of the fourth p-channel transistor to which the inverted clock signal is inputted; a second terminal of the fourth n-channel transistor and a second terminal of the fourth p-channel transistor which are electrically connected to each other; and the second terminals of the fourth n-channel transistor and the fourth p-channel transistor are electrically connected to the input terminal of the second inverter circuit.

Another display device of the invention includes: a gate driver, a source driver, and a pixel portion connected to the source driver and the gate driver. The source driver includes a shift register circuit and a latch circuit; the gate driver includes a shift register circuit; each of the shift register circuit of the source driver and the shift register circuit of the gate driver has multiple stages of semiconductor circuits each having a first n-channel transistor, a first p-channel transistor, a second n-channel transistor, a second p-channel transistor, a first inverter circuit, a third n-channel transistor, a third p-channel transistor, a fourth n-channel transistor, a fourth p-channel transistor, and a second inverter circuit. Each of the semiconductor circuits constitutes a gate terminal of the first n-channel transistor and the first p-channel transistor to which a first input signal is inputted; a first terminal of the first p-channel transistor to which a clock signal is inputted; a first terminal of the first n-channel transistor to which an inverted timing control signal is inputted; a second terminal of the first n-channel transistor and a second terminal of the first p-channel transistor which are electrically connected to each other; the second terminal of the first n-channel transistor and the second terminal of the first p-channel transistor are electrically connected to an input terminal of the first inverter circuit; a gate terminal of the second n-channel transistor and a gate terminal of the second p-channel transistor to which a second signal that is outputted from an output terminal of the first inverter circuit is inputted; a first terminal of the second n-channel transistor to which the clock signal is inputted; a first terminal of the second p-channel transistor to which the inverted clock signal is inputted; a second terminal of the second n-channel transistor and a second terminal of the second p-channel transistor which are electrically connected to each other; the second terminals of the second n-channel transistor and the second p-channel transistor are electrically connected to the input terminal of the first inverter circuit; a gate terminal of the third n-channel transistor and a gate terminal of the third p-channel transistor to which the second signal is inputted; a first terminal of the third n-channel transistor to which a clock signal is inputted; a first terminal of the third p-channel transistor to which a inverted clock signal is inputted; a second terminal of the third n-channel transistor and a second terminal of the third p-channel transistor which are electrically connected to each other; the second terminals of the third n-channel transistor and the third p-channel transistor are electrically connected to an input terminal of the second inverter circuit; a gate terminal of the fourth n-channel transistor and a gate terminal of the fourth p-channel transistor to which a third signal that is outputted from an output terminal of the second inverter circuit is inputted; a first terminal of the fourth p-channel transistor to which the clock signal is inputted; a first terminal of the fourth n-channel transistor to which the inverted clock signal is inputted; a second terminal of the fourth n-channel transistor and a second terminal of the fourth p-channel transistor which are electrically connected to each other; and the second terminals of the fourth n-channel transistor and the fourth p-channel transistor are electrically connected to the input terminal of the second inverter circuit.

The n-channel transistors and the p-channel transistors of the invention may constitute thin film transistors formed over a glass substrate.

Alternatively, the n-channel transistors and the p-channel transistors of the invention may be formed over a single crystalline substrate.

In addition, the display device of the invention may be formed by using a liquid crystal element or an OLED (EL) element.

In addition, the invention can provide an electronic appliance where the number of transistors can be reduced by using n-channel transistors and p-channel transistors instead of using 2 clocked inverters that have a total of 8 transistors and thus occupy the semiconductor circuit in FIGS. 23 and 24.

More specifically, an electronic apparatus of the invention has a display panel provided with a gate driver, a source driver, and a pixel portion connected to the gate driver and the source driver. The source driver includes a shift register circuit and a latch circuit, and the gate driver includes a shift register circuit. Each of the shift register and the latch circuit of the source driver and the shift register circuit of the gate driver has a semiconductor circuit having first n-channel transistor, a first p-channel transistor, a second n-channel transistor, a second p-channel transistor, and an inverter circuit. The semiconductor circuit constitutes a gate terminal of the first n-channel transistor and a gate terminal of the first p-channel transistor to which a first input signal is inputted; a first terminal of the first n-channel transistor to which a timing control signal is inputted; a first terminal of the first p-channel transistor to which an inverted timing control signal is inputted; a second terminal of the first n-channel transistor and a second terminal of the first p-channel transistor which are electrically connected to each other; the second terminals of the first n-channel transistor and the first p-channel transistor are electrically connected to an input terminal of the inverter circuit; a gate terminal of the second n-channel transistor and a gate terminal of the second p-channel transistor to which a second signal that is outputted from an output terminal of the inverter circuit is inputted; a first terminal of the second p-channel transistor to which the timing control signal is inputted; a first terminal of the second n-channel transistor to which the inverted timing control signal is inputted; a second terminal of the second n-channel transistor and a second terminal of the second p-channel transistor which are electrically connected to each other; and the second terminals of the second n-channel transistor and the second p-channel transistor are electrically connected to the input terminal of the inverter circuit.

Another electronic apparatus of the invention has a display panel provided with a gate driver, a source driver, and a pixel portion connected to the gate driver and the source driver. The source driver includes a shift register circuit and a latch circuit, and the gate driver includes a shift register circuit. Each of the shift register circuit of the source driver and the shift register circuit of the gate driver has a semiconductor circuit having first n-channel transistor, a first p-channel transistor, a second n-channel transistor, a second p-channel transistor, and an inverter circuit. The semiconductor circuit constitutes a gate terminal of the first n-channel transistor and a gate terminal of the first p-channel transistor to which a first input signal is inputted; a first terminal of the first p-channel transistor to which a timing control signal is inputted; a first terminal of the first n-channel transistor to which an inverted timing control signal is inputted; a second terminal of the first n-channel transistor and a second terminal of the first p-channel transistor which are electrically connected to each other; the second terminals of the first n-channel transistor and the first p-channel transistor are electrically connected to an input terminal of the inverter circuit; a gate terminal of the second n-channel transistor and a gate terminal of the second p-channel transistor to which a second signal that is outputted from an output terminal of the inverter circuit is inputted; a first terminal of the second n-channel transistor to which the timing control signal is inputted; a first terminal of the second p-channel transistor to which the inverted timing control signal is inputted; a second terminal of the second n-channel transistor and a second terminal of the second p-channel transistor are electrically connected to each other; and the second terminals of the second n-channel transistor and the second p-channel transistor are electrically connected to the input terminal of the inverter circuit.

Another electronic apparatus of the invention has a display panel provided with a gate driver, a source driver, and a pixel portion connected to the gate driver and the source driver. The source driver includes a shift register circuit and a latch circuit, and the gate driver includes a shift register circuit. Each of the shift register circuit of the source driver and the shift register circuit of the gate driver has multiple stages of semiconductor circuits each having first n-channel transistor, a first p-channel transistor, a second n-channel transistor, a second p-channel transistor, a first inverter circuit, a third n-channel transistor, a third p-channel transistor, a fourth n-channel transistor, a fourth p-channel transistor, and a second inverter circuit. Each of the semiconductor circuits constitutes a gate terminal of the first n-channel transistor and a gate terminal of the first p-channel transistor to which a first input signal is inputted; a first terminal of the first n-channel transistor to which a clock signal is inputted; a first terminal of the first p-channel transistor to which an inverted clock signal is inputted; a second terminal of the first n-channel transistor and a second terminal of the first p-channel transistor which are electrically connected to each other; the second terminal of the first n-channel transistor and the second terminal of the first p-channel transistor are electrically connected to an input terminal of the first inverter circuit; a gate terminal of the second n-channel transistor and a gate terminal of the second p-channel transistor to which a second signal that is outputted from an output terminal of the first inverter circuit is inputted; a first terminal of the second p-channel transistor to which the clock signal is inputted; a first terminal of the second n-channel transistor to which the inverted clock signal is inputted; a second terminal of the second n-channel transistor and a second terminal of the second p-channel transistor which are electrically connected to each other; the second terminals of the second n-channel transistor and the second p-channel transistor are electrically connected to the input terminal of the first inverter circuit; a gate terminal of the third n-channel transistor and a gate terminal of the third p-channel transistor to which the second input signal is inputted; a first terminal of the third p-channel transistor to which the clock signal is inputted; a first terminal of the third n-channel transistor to which the inverted clock signal is inputted; a second terminal of the third n-channel transistor and a second terminal of the third p-channel transistor which are electrically connected to each other; the second terminals of the third n-channel transistor and the third p-channel transistor are electrically connected to an input terminal of the second inverter circuit; a gate terminal of the fourth n-channel transistor and a gate terminal of the fourth p-channel transistor to which a third signal that is outputted from an output terminal of the second inverter circuit is inputted; a first terminal of the fourth n-channel transistor to which the clock signal is inputted; a first terminal of the fourth p-channel transistor to which the inverted clock signal is inputted; a second terminal of the fourth n-channel transistor and a second terminal of the fourth p-channel transistor which are electrically connected to each other; and the second terminals of the fourth n-channel transistor and the fourth p-channel transistor are electrically connected to the input terminal of the second inverter circuit.

Another electronic apparatus of the invention has a display panel provided with a gate driver, a source driver, and a pixel portion connected to the gate driver and the source driver. The source driver includes a shift register circuit and a latch circuit, and the gate driver includes a shift register circuit. Each of the shift register circuit of the source driver and the shift register circuit of the gate driver has multiple stages of semiconductor circuits each having first n-channel transistor, a first p-channel transistor, a second n-channel transistor, a second p-channel transistor, a first inverter circuit, a third n-channel transistor, a third p-channel transistor, a fourth n-channel transistor, a fourth p-channel transistor, and a second inverter circuit. Each of the semiconductor circuits constitutes a gate terminal of the first n-channel transistor and a gate terminal of the first p-channel transistor to which a first input signal is inputted; a first terminal of the first p-channel transistor to which a clock signal is inputted; a first terminal of the first n-channel transistor to which an inverted clock signal is inputted; a second terminal of the first n-channel transistor and a second terminal of the first p-channel transistor a which are electrically connected to each other; the second terminals of the first n-channel transistor and the first p-channel transistor are electrically connected to an input terminal of the first inverter circuit; a gate terminal of the second n-channel transistor and a gate terminal of the second p-channel transistor to which a second signal that is outputted from an output terminal of the first inverter circuit is inputted; a first terminal of the second n-channel transistor to which a clock signal is inputted; a first terminal of the second p-channel transistor to which a inverted clock signal is inputted; a second terminal of the second n-channel transistor and a second terminal of the second p-channel transistor which are electrically connected to each other; the second terminals of the second n-channel transistor and the second p-channel transistor are electrically connected to the input terminal of the first inverter circuit; a gate terminal of the third n-channel transistor and a gate terminal of the third p-channel transistor to which the second input signal is inputted; a first terminal of the third n-channel transistor to which the clock signal is inputted; a first terminal of the third p-channel transistor to which the inverted clock signal is inputted; a second terminal of the third n-channel transistor and a second terminal of the third p-channel transistor electrically connected to each other; the second terminals of the third n-channel transistor and the third p-channel transistor are electrically connected to an input terminal of the second inverter circuit; a gate terminal of the fourth n-channel transistor and a gate terminal of the fourth p-channel transistor to which a third signal that is outputted from an output terminal of the second inverter circuit is inputted; a first terminal of the fourth p-channel transistor to which the clock signal is inputted; a first terminal of the fourth n-channel transistor to which the inverted clock signal is inputted; a second terminal of the fourth n-channel transistor and a second terminal of the fourth p-channel transistor which are electrically connected to each other; and the second terminals of the fourth n-channel transistor and the fourth p-channel transistor are electrically connected to the input terminal of the second inverter circuit.

In addition, the invention provides an electronic apparatus where a liquid crystal element or an OLED (EL) element is used in the aforementioned display panel.

The electronic apparatus of the invention corresponds to a television receiver, a video camera, a digital camera, a goggle display, a navigation system, an audio reproducing device, a computer, a game machine, a mobile computer, a portable phone, a portable game machine, an electronic book, or an image reproducing device.

In accordance with the invention, the number of transistors that constitute a semiconductor circuit can be reduced from 10 to 6, thereby the layout area can be reduced. In particular, the semiconductor circuit of the invention can be particularly effectively applied to the case of using multiple stages of semiconductor circuits such as a shift register circuit or a latch circuit, thereby variations in performance can be suppressed in manufacturing transistors, and also the yield can be expected to be improved.

In the display device using the semiconductor circuit of the invention, by reducing the number of transistors that constitute the semiconductor circuit from 10 to 6, the layout area of a peripheral circuit can be reduced in accordance with the increased area of the pixel portion. In the case of integrally forming transistors of a pixel portion and a peripheral circuit over a common substrate, the number of transistors that constitute the semiconductor circuit can be reduced from 10 to 6 by applying the semiconductor circuit of the invention, thereby variations in performance of transistors can be suppressed, and also the yield can be expected to be improved the yield can be expected to be improved.

In the electronic apparatus using the semiconductor circuit of the invention, the layout area of a display portion can be reduced; therefore, the electronic apparatus can be reduced in size and weight. Further, products with a high yield can be manufactured, so that products can be provided to customers at lower cost.

BRIEF DESCRIPTION OF THE DRAWINGS

FIG. 6(a) is a circuit diagram showing the configuration of Embodiment 2 and FIGS. 6(b)-6(e) are diagrams showing output waveforms thereof.

FIG. 7 is a block diagram of Embodiment 3.

FIGS. 10(a)-10(c) are cross-sectional views showing the manufacturing steps of transistors in Embodiment 4.

FIGS. 11(a)-11(c) are cross-sectional views showing the manufacturing steps of transistors in Embodiment 4.

FIG. 13 is a cross-sectional view of a liquid crystal module in Embodiment 5.

FIG. 14 is a perspective view of a liquid crystal module in Embodiment 5.

FIG. 15(a) is a perspective view of an OLED (EL) module in Embodiment 6, and FIG. 15(b) is a cross-sectional view thereof.

FIG. 16 is a cross-sectional view of transistors in Embodiment 7.

FIG. 17 is a view showing an example of an electronic apparatus to which the invention is applied.

FIG. 21 is a view showing an example of an electronic apparatus to which the invention is applied.

DETAILED DESCRIPTION OF THE PRESENTLY PREFERRED EMBODIMENTS

Embodiment Mode 1

Figure 1A:
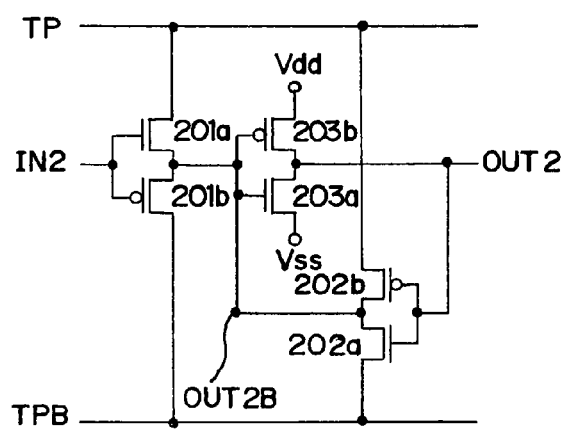
FIG. 1(a) is a circuit diagram showing the configuration of Embodiment Mode 1.

FIG. 1(a) shows one embodiment mode of a semiconductor circuit of the invention. As shown in FIG. 1(a), the first clocked inverter CKINV1 and the second clocked inverter CKINV2 of a conventional semiconductor circuit are replaced by circuits constructed of n-channel transistors and p-channel transistors. Here, the n-channel transistors and the p-channel transistors correspond to a first n-channel transistor 201a, a first p-channel transistor 201b, a second n-channel transistor 202a, and a second p-channel transistor 202b. In this specification, a terminal to serve as a source electrode or a drain electrode of the first n-channel transistor 201a, and a terminal to serve as a source electrode or a drain electrode of the second p-channel transistor 202b, to each of which a timing control signal TP is inputted, are called first terminals. In addition, a terminal to serve as a source electrode or a drain electrode of the first p-channel transistor 201b, and a terminal to serve as a source electrode or a drain electrode of the second n-channel transistor 202a, to each of which an inverted timing control signal TPB is inputted, are called first terminals. Meanwhile, the other terminal of each transistor to which neither a timing control signal nor an inverted timing control signal is inputted is called a second terminal.

The second terminal of the first n-channel transistor and the second terminal of the first p-channel transistor are electrically connected to each other. In addition, the second terminal of the second p-channel transistor 202b and the second terminal of the second n-channel transistor 202a are electrically connected to each other.

In the case where a timing control signal TP is inputted to the first terminal of the first n-channel transistor 201a, an inverted timing control signal TPB is inputted to the first terminal of the first p-channel transistor 201b. On the other hand, in the case where the inverted timing control signal TPB is inputted to the first terminal of the n-channel transistor 201a, the timing control signal TP is inputted to the first terminal of the first p-channel transistor 201b.

The second terminal of the first n-channel transistor 201a is connected to the second terminal of the first p-channel transistor 201b. Gate electrodes of the first n-channel transistor 201a and the first p-channel transistor 201b correspond to an input terminal, and the second terminal of the first n-channel transistor 201a and the second terminal of the first p-channel transistor 201b are connected to the input terminal of the inverter INV.

Here, in the case where the timing control signal TP is inputted to the first terminal of the first n-channel transistor 201a, the inverted timing control signal TPB is inputted to the first terminal of the first n-channel transistor 202a while the timing control signal TP is inputted to the first terminal of the second p-channel transistor 202b. On the other hand, in the case where the inverted timing control signal TPB is inputted to the first terminal of the first n-channel transistor 201a, the timing control signal TP is inputted to the first terminal of the second n-channel transistor 202a while the inverted timing control signal TPB is inputted to the first terminal of the second p-channel transistor 202b.

The second terminal of the second n-channel transistor 202a to function as the second clocked inverter CKINV2 is connected to the second terminal of the second p-channel transistor 202b. Gate electrodes of the second n-channel transistor 202a and the second p-channel transistor 202b are connected to the output terminal of the inverter INV, and the second terminal of the second n-channel transistor 202a and the second terminal of the second p-channel transistor 202b are connected to the input terminal of the inverter INV.

The inverter INV is configured with an n-channel transistor 203a and a p-channel transistor 203b. A source electrode of the n-channel transistor 203a is kept at a low power source potential Vss while a drain electrode of the n-channel transistor 203a is connected to a drain electrode of the p-channel transistor 203b. A source electrode of the p-channel transistor 203b is kept at a high power source potential Vdd. Gate electrodes of the n-channel transistor 203a and the p-channel transistor 203b correspond to the input terminal of the inverter INV, and the drain electrodes of the n-channel transistor 203a and the p-channel transistor 203b correspond to the output terminal of the inverter INV.

Figure 1B:
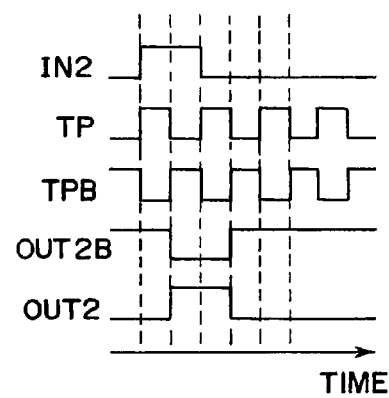
FIG. 1(b) is a timing chart thereof.

FIG. 1(b) is a timing chart showing an ideal driving method of a semiconductor circuit having the configuration shown in FIG. 1(a), and description is made below on the specific operation.

A timing control signal TP, an inverted timing control signal TPB that is obtained by inverting the timing control signal, and an input signal IN2 are inputted to the semiconductor circuit. The timing control signal TP is inputted to the first terminal of the first n-channel transistor 201a while the inverted timing control signal TPB is inputted to the first terminal of the first p-channel transistor 201b. The input signal IN2 is inputted to the gate electrodes of the first n-channel transistor 201a and the first p-channel transistor 201b.

The relationship between the input signal IN2, the timing control signal TP and the inverted timing control signal TPB is as shown in the timing chart in FIG. 1(b).

To the input terminal of the first n-channel transistor 201a to which the timing control signal TP is inputted and the first p-channel transistor 201b to which the inverted timing control signal TPB is inputted, a "Lo" potential is inputted by the input signal IN2, thereby the first p-channel transistor 201b is turned on. Then, the output terminal of the first n-channel transistor 201a and the first p-channel transistor 201b has a potential of the inverted timing control signal TPB. That is, an output OUT2B has a "Hi" potential. At this time, the second n-channel transistor 202a and the second p-channel transistor 202b are turned off by the timing control signal TP and the inverted timing control signal TPB inputted to the first terminals thereof.

Then, when the input signal IN2 becomes a "Hi" potential, the first n-channel transistor 201a and the first p-channel transistor 201b are turned off by the timing control signal TP and the inverted timing control signal TPB.

The gate electrodes of the second n-channel transistor 202a and the second p-channel transistor 202b are inputted with the output OUT2B that corresponds to the second terminals of the first n-channel transistor 201a and the first p-channel transistor 201b, through the inverter INV. That is, the gate electrodes of the second n-channel transistor 202a and the second p-channel transistor 202b are inputted with a signal obtained by inverting the output OUT2B of the second terminals of the first n-channel transistor 201a and the first p-channel transistor 201b. By this signal, the timing control signal TP and the inverted timing control signal TPB, the second p-channel transistor 202b is turned on. In this manner, the output OUT2B corresponding to the second terminals of the second n-channel transistor 202a and the second p-channel transistor 202b has a "Hi" potential that is the potential of the timing control signal TP.

Then, the first n-channel transistor 201a is turned on by the timing control signal TP and the inverted timing control signal TPB. Thus, the output OUT2B corresponding to the second terminals of the first n-channel transistor 201a and the first p-channel transistor 201b has a potential of the timing control signal TP, that is a "Lo" potential. At this time, the second n-channel transistor 202a and the second p-channel transistor 202b are turned off by the timing control signal TP and the inverted timing control signal TPB that are inputted to the first terminals of the second n-channel transistor 202a and the second p-channel transistor 202b.

Next, when the start pulse SP becomes "Lo", the first n-channel transistor 201a and the first p-channel transistor 201b are turned off by the timing control signal TP and the inverted timing control signal TPB.

The gate electrodes of the second n-channel transistor 202a and the second p-channel transistor 202b are inputted with the output OUT2B that corresponds to the second terminals of the first n-channel transistor 201a and the first p-channel transistor 201b, through the inverter INV. That is, the gate electrodes of the second n-channel transistor 202a and the second p-channel transistor 202b are inputted with a signal obtained by inverting the output OUT2B of the second terminals of the first n-channel transistor 201a and the first p-channel transistor 201b. By this signal, the timing control signal TP and the inverted timing control signal TPB, the second n-channel transistor 202a is turned on. Thus, the output OUT2B corresponding to the second terminals of the second n-channel transistor 202a and the second p-channel transistor 202b has a "Lo" potential that is the potential of the inverted timing control signal TPB.

As set forth above, the output of the second terminals of the first n-channel transistor 201a and the second p-channel transistor 201b, and the output of the second terminals of the n-channel transistor 202a and the p-channel transistor 202b are changed. In this manner, the output OUT2 outputs the input signal IN when the timing control signal TP is at "Lo" whereas it holds signals that have been outputted until then when the timing control signal TP is at "Hi". In this manner, the semiconductor circuit shown in FIG. 1(a) outputs pulses.

Note that this embodiment mode can be freely implemented in combination with any of the descriptions of embodiments in this specification.

Embodiment 1

Description is made below on an embodiment of the invention.

Figure 2A:
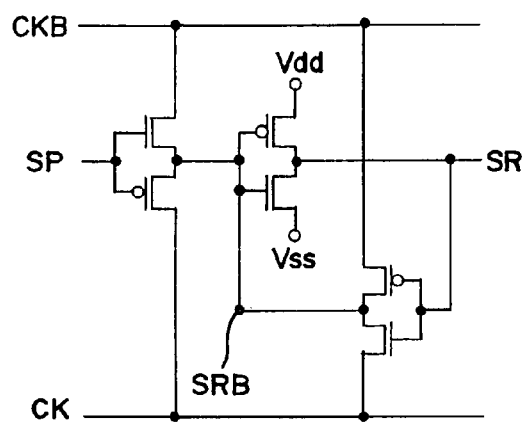
FIG. 2(a) is a circuit diagram showing the configuration of Embodiment 1.

FIG. 2(a) is a circuit constructed for the purpose of using the semiconductor circuit of the invention as a shift register circuit. Here, a start pulse SP is used as the input signal IN, a clock signal CK is used as the timing control signal TP, and an inverted clock signal CKB is used as the inverted timing control signal TPB. In addition, the circuit outputs SR.

Figure 2B:
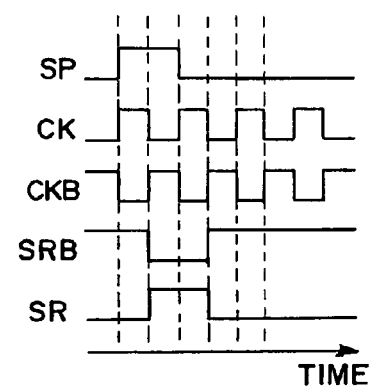
FIG. 2(b) is a timing chart thereof.

FIG. 2(b) shows a timing chart of FIG. 2(a). Description on the operation of the timing chart in FIG. 2(b) is omitted since it is shown in Embodiment Mode 1.

Figure 3A:
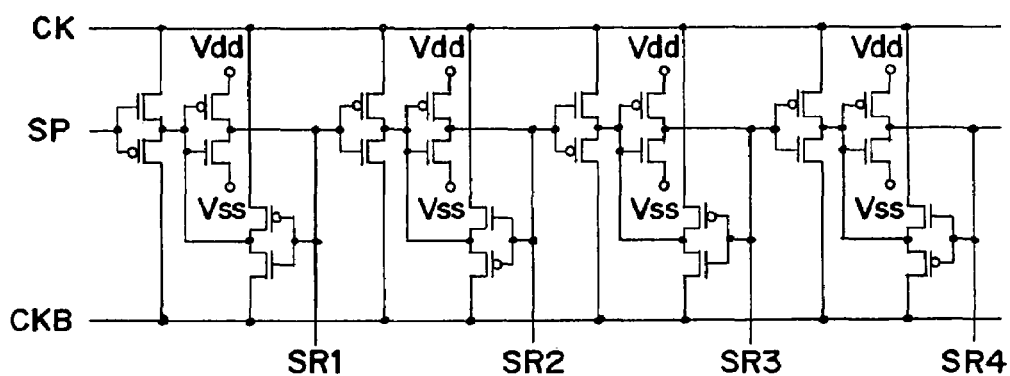
FIG. 3(a) is a circuit diagram showing the configuration of Embodiment 1.
Figure 3B:
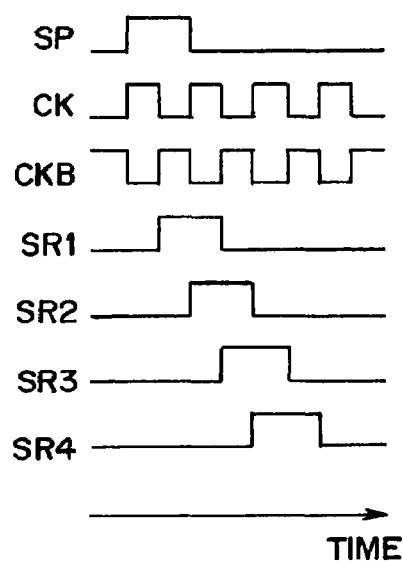
FIG. 3(b) is a timing chart thereof.

FIG. 3(a) shows an example where four stages of the shift register circuit in FIG. 2(a) are used. FIG. 3(b) shows a timing chart thereof. Note that an output of a first-stage shift register is SR1, an output of a second-stage shift register is SR2, an output of a third-stage shift register is SR3, and an output of a fourth-stage shift register is SR4.

In constructing multiple stages of the shift register circuit in FIG. 3(a), a clock signal and an inverted clock signal to be inputted to the first terminals of the first n-channel transistor, the first p-channel transistor, the second n-channel transistor, and the second p-channel transistor are switched per stage. Accordingly, the timing for sampling and holding an input signal of a prior stage is shifted by half a pulse of the clock signal CK and the inverted clock signal CKB as shown in FIG. 3(b), thereby pulses are sequentially outputted.

Figure 4A:
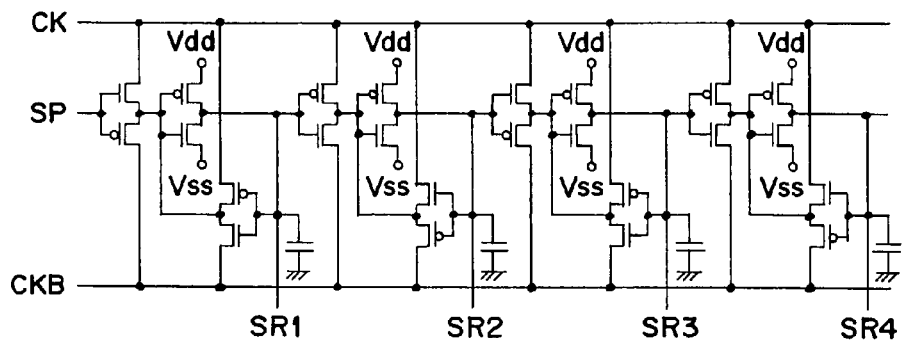
FIG. 4(a) is a circuit diagram showing a shift register of Embodiment 1, and FIG. 4(b) are diagrams showing output waveforms thereof.
Figure 4B:
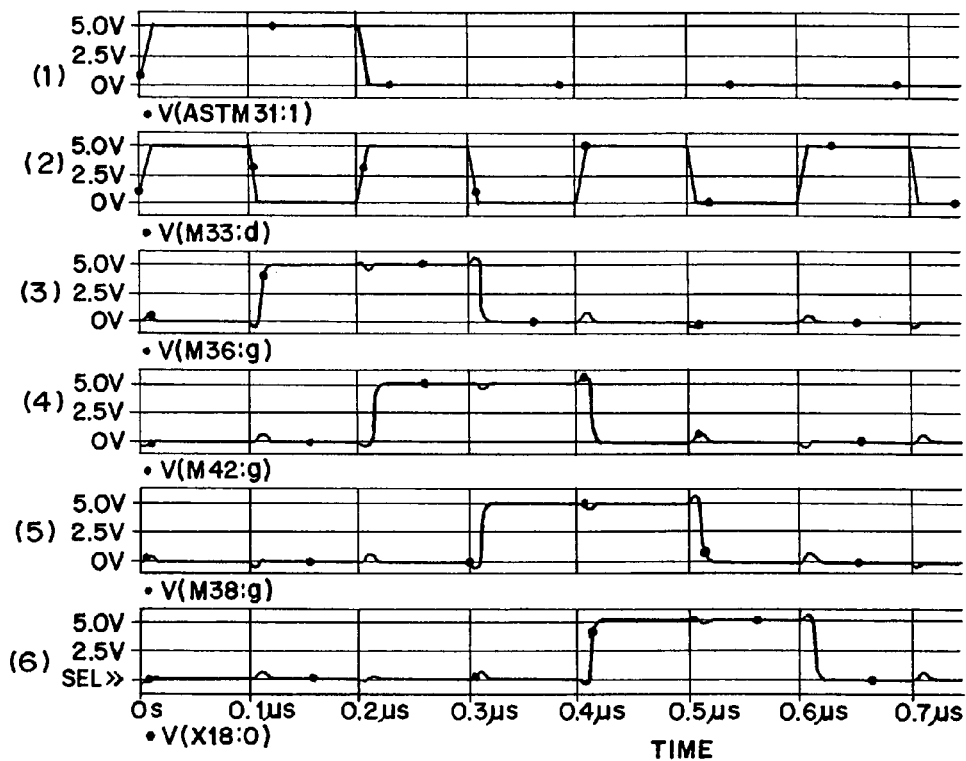

FIG. 4(a) is a diagram showing an example of actually designing the shift register. FIG. 4(b) shows the calculation result of waveforms. As for the channel length and the channel width of each transistor, each of the n-channel transistors and the p-channel transistors is formed to have a channel length of 3.5 μm and a channel width of 10 μm. In addition, the capacitance value is each set to 10 fF. As an operating condition, an amplitude of the input signal IN2, the clock signal CK and the inverted clock signal CKB is set such that L level=0 V and H level=5 V, and a power source voltage of the circuit is set such that Vdd=5 V and Vss=0 V. In addition, the drive frequency is set to 5 MHz. In FIG. 4(b), (1) shows a start pulse SP, (2) shows a clock signal CK, (3) shows an output SR1 of the first-stage shift register, (4) shows an output SR2 of the second-stage shift register, (5) shows an output SR3 of the third-stage shift register, and (6) shows an output SR4 of the fourth-stage shift register. Note that the transistor size, the capacitance value and the operating condition are set only in accordance with the requirements for calculating the waveforms; therefore, the invention is not limited to such values.

Here, when comparing the calculation result of the waveforms in FIG. 4(b) with that of FIG. 3(b), the same start pulse SP, clock signal CK, and inverted clock signal CKB are inputted; FIG. 4(b)-(3) showing the output as the output SR1 of the first-stage shift register corresponds to the SR1 in FIG. 3(b); FIG. 4(b)-(4) showing the output as the output SR2 of the second-stage shift register corresponds to the SR2 in FIG. 3(b); FIG. 4(b)-(5) showing the output as the output SR3 of the third-stage shift register corresponds to SR3 in FIG. 3(b); and FIG. 4(b)-(6) showing the output as the output SR4 of the fourth-stage shift register corresponds to SR4 in FIG. 3(b). That is, the circuit of the invention having a reduced number of transistors can achieve the same operation as that of the conventional semiconductor circuit. Therefore, the layout area can be reduced in accordance with the reduced number of transistors. In addition, variations in performance can be suppressed in manufacturing transistors, thereby the yield can be expected to be improved.

This embodiment can be freely implemented in combination with any of the aforementioned embodiment mode and embodiment.

Embodiment 2

Figure 5A:
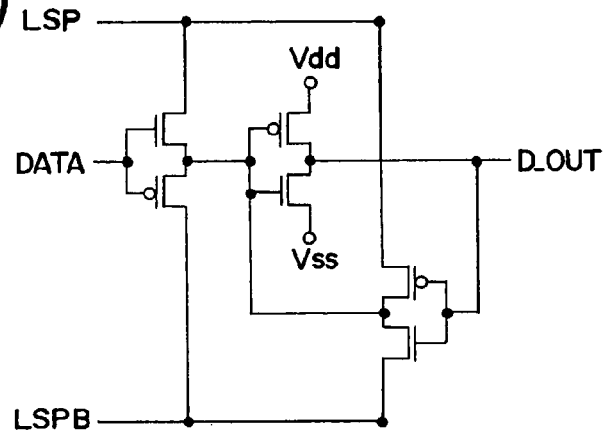
FIG. 5(a) is a circuit diagram showing the configuration of Embodiment 2 and FIGS. 5(b)-5(e) are timing charts thereof.

FIG. 5(a) is a circuit constructed for the purpose of using the semiconductor circuit of the invention as a latch circuit. Here, a data signal DATA is used as the input signal IN, a sampling pulse LSP is used as the timing control signal TP, and an inverted sampling pulse LSPB is used as the inverted timing control signal TPB. In addition, the circuit outputs D_OUT.

Figure 5B:
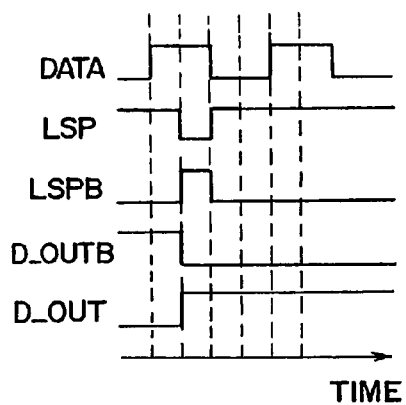

FIGS. 5(b), (c), (d) and (e) show timing charts of FIG. 5(a). Note that an initial state of the output D_OUT is at "Lo". As for the operation of the timing charts in FIGS. 5(b), (c), (d) and (e), the data signal DATA is sampled when the sampling pulse LSP is at "Lo" whereas the previous output is held when the sampling pulse LSP is at "Hi" as shown in Embodiment Mode 1. In each of the timing charts, it can be seen that the data signal DATA right before the sampling pulse LSP changes from "Lo" to "Hi" continues to be held.

FIG. 6(a) is a diagram showing an example of actually designing the latch circuit. FIGS. 6(b), (c), (d) and (e) show the calculation result of waveforms. As for the channel length and the channel width of each transistor, each of the n-channel transistors and the p-channel transistors is formed to have a channel length of 3.5 μm and a channel width of 10 μm. In addition, the capacitance value is set to 10 fF. As an operating condition, an amplitude of the data signal DATA, the sampling pulse LSP and the inverted sampling pulse LSPB is set such that L level=0 V and H level=5 V, and a power source voltage of the circuit is set such that Vdd=5 V and Vss=0 V. In FIGS. 6(b), (c), (d) and (e), (1) shows a data signal DATA, (2) shows a sampling pulse LSP, and (3) shows an output D_OUT. Note that the transistor size, the capacitance value and the operating condition are set only in accordance with the requirements for calculating the waveforms; therefore, the invention is not limited to such values.

Figure 5C:
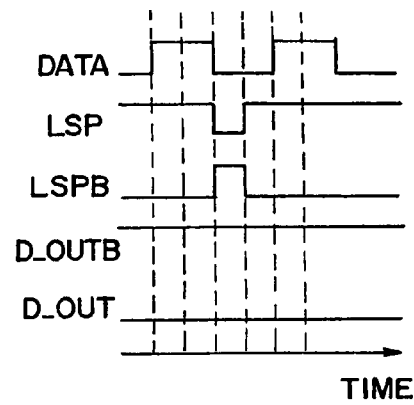
Figure 5D:
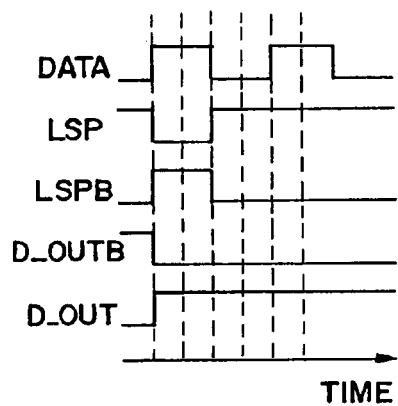
Figure 5E:
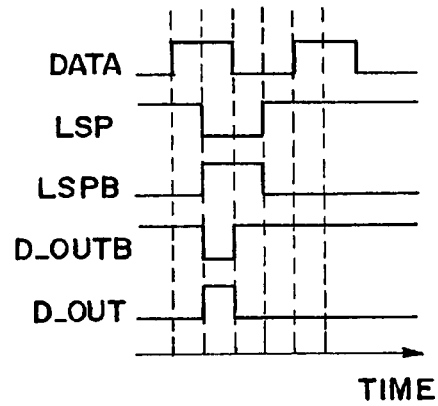

Here, when comparing the calculation result of the waveforms in FIGS. 6(b), (c), (d) and (e) with that of FIGS. 5(b), (c), (d) and (e), the same data signal DATA, sampling pulse LSP and inverted sampling pulse LSPB are inputted; FIG. 6(b)-(3) showing the output of the latch circuit corresponds to D_OUT in FIG. 5(b); FIG. 6(c)-(3) corresponds to D_OUT in FIG. 5(c); FIG. 6(d)-(3) corresponds to D_OUT in FIG. 5(d); and FIG. 6(e)-(3) corresponds to D_OUT in FIG. 5(e). That is, the circuit of the invention having a reduced number of transistors can achieve the same operation as that of the conventional semiconductor circuit. Therefore, the layout area can be reduced in accordance with the reduced number of transistors. In addition, variations in performance can be suppressed in manufacturing transistors, thereby the yield can be expected to be improved.

This embodiment can be freely implemented in combination with any of the aforementioned embodiment mode and embodiment.

Embodiment 3

FIG. 7 shows an example where the whole active matrix display device is shown in a block diagram. A source driver 302, a writing gate driver 303 and an erasing gate driver 304 are disposed around a pixel portion 301.

The source driver 302 has a shift register 305, a NAND circuit 306, a first latch circuit 307, a second latch circuit 308, and a level shifter/buffer 309. The writing gate driver 303 has a shift register 310, a NAND circuit 311, and a level shifter/buffer 312. Similarly, the erasing gate driver 304 has a shift register 313, a NAND circuit 314, and a level shifter/buffer 315.

In the source driver 302, the shift register 305 sequentially outputs pulses from the first stage in accordance with a source clock signal SCK, an inverted source clock signal SCKB, and a source start pulse SSP. Overlapped portions of the adjacent pulses that are outputted from the shift register 305 are taken out by the NAND circuit 306, and then outputted as a sampling pulse LSP. In accordance with the sampling pulse LSP, the first latch circuit 307 samples data signals DATA. In the stages where sampling is completed, the data signals DATA are held in a memory portion provided in the first latch circuit 307 until the sampling at the last stage is completed. After the sampling pulse of the last stage is outputted, and the sampling is completed at all the stages of the first latch circuit 307, one row of data that has been held in the first latch circuit 307 is transferred to the second latch circuit 308 all at once in accordance with a latch pulse LAT and an inverted latch pulse LATB. After that, the level shifter/buffer 309 converts the amplitude of the signals as required, and then source signal lines are charged/discharged in accordance with the video signals.

Figure 8:
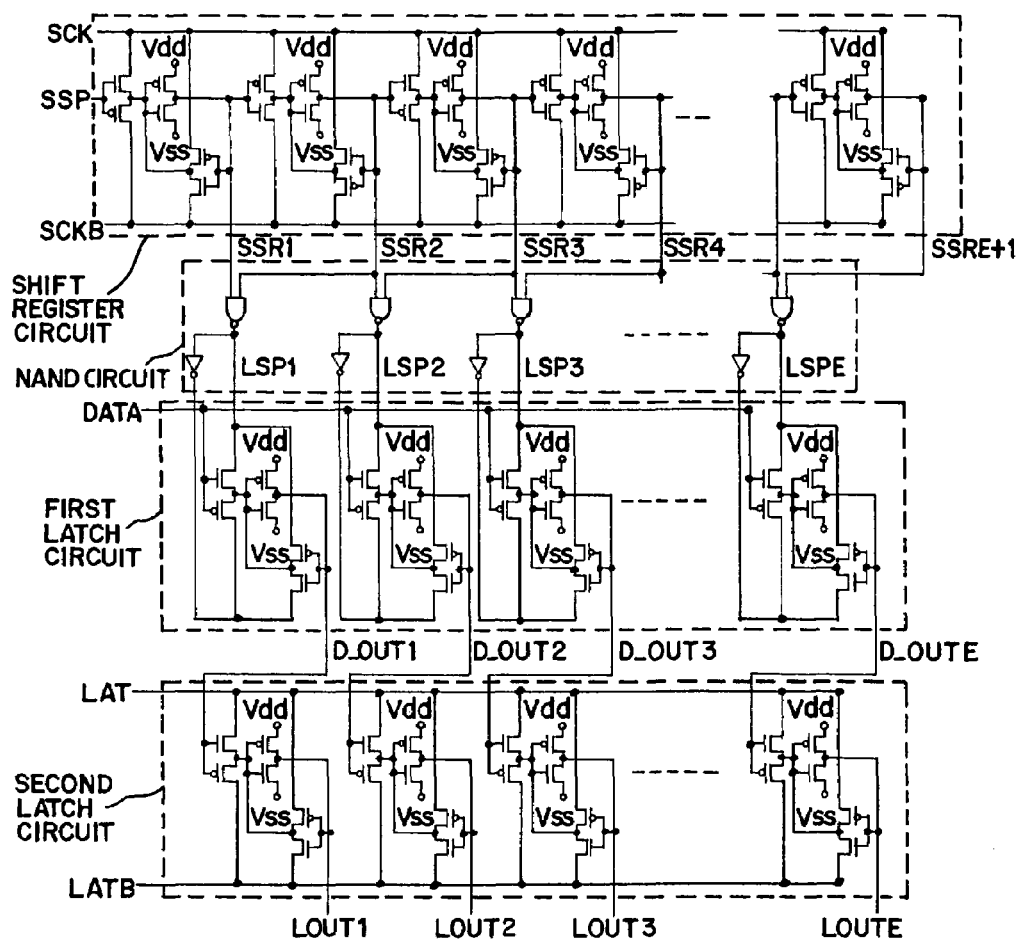
FIG. 8 is a circuit diagram of Embodiment 3.

FIG. 8 shows a specific example of a connection between the shift register 305, the NAND circuit 306, the first latch circuit 307 and the second latch circuit 308 in the source driver 302 in FIG. 7.

FIG. 8 shows semiconductor circuits where the semiconductor circuits of the invention shown in Embodiments 1 and 2 are used as the shift register circuit, the first latch circuit and the second latch circuit.

Figure 9:
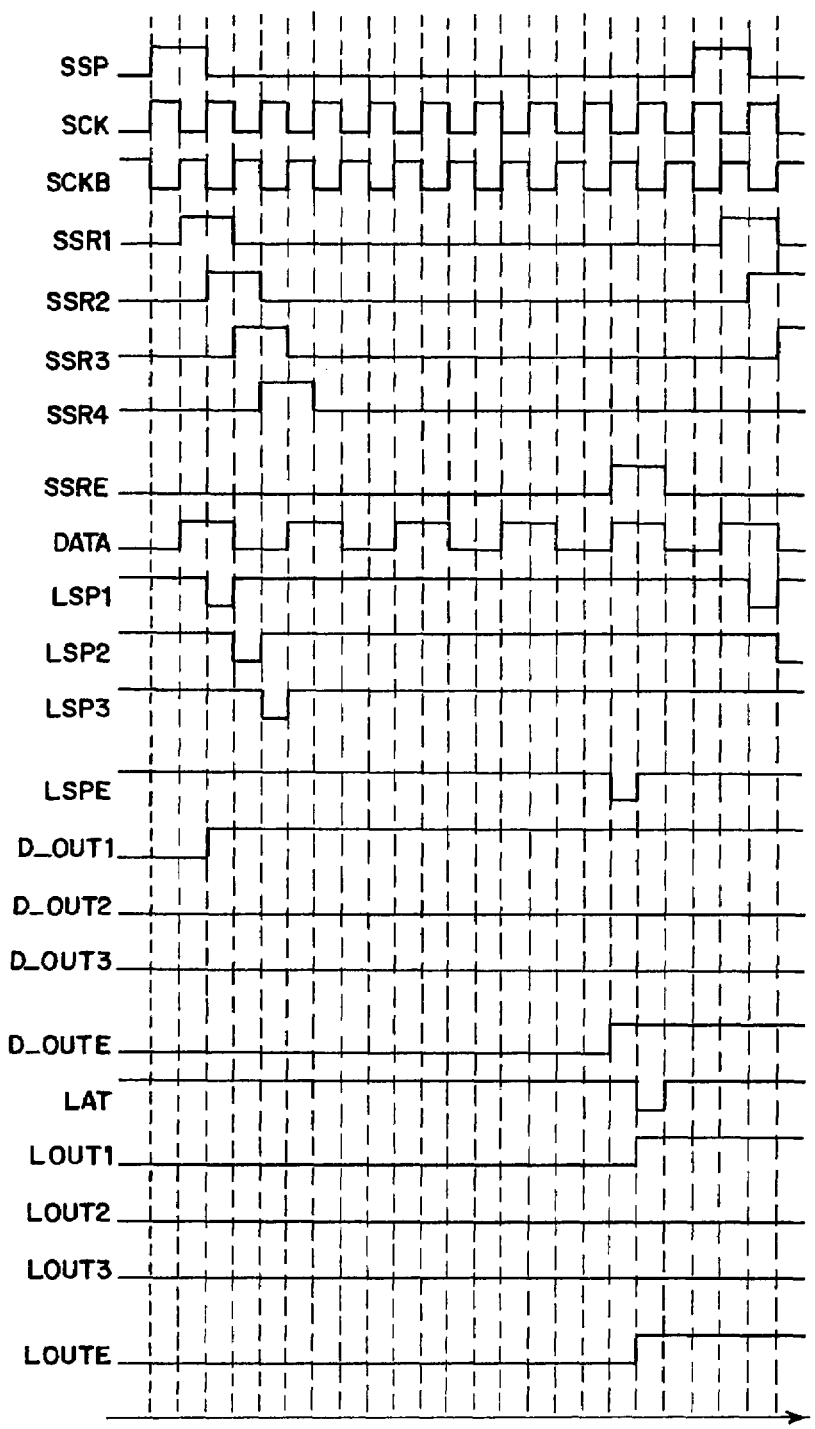
FIG. 9 is a timing chart of Embodiment 3.

FIG. 9 shows a timing chart of the semiconductor circuit in FIG. 8. Here, a source start pulse SSP, a source clock signal SCK and an inverted source clock signal SCKB are inputted to the shift register. An output of a first-stage shift register is SSR1, an output of a second-stage shift register is SSR2, an output of a third-stage shift register is SSR3, an output of a fourth-stage shift register is SSR4, and an output of a last-stage shift register is SSRE+1.

Here, the NAND circuit is inputted with signals that are sequentially outputted from two adjacent shift registers, and outputs sampling pulses LSP. Since the sampling pulses LSP outputted from the respective NAND circuits are separate signals, the sampling pulses LSP are given numbers of LSP1, LSP2, . . . in order from the left side. In addition, only an output of the NAND circuit that is inputted with one output SSRE+1 of the last-stage shift register is referred to as LSPE.

Then, a data signal DATA is inputted to the first latch circuit from outside, and the sampling pulses LSP1 to LSPE are inputted to the respective stages from the NAND circuits. In addition, signals obtained by inverting the sampling pulses LSP1 to LSPE are inputted to the respective stages of the first latch circuit. Signals outputted from the first latch circuit correspond to outputs D_OUT1, D_OUT2, . . . in accordance with the inputted sampling pulses LSP as LSP1, LSP2, . . . respectively. The output of the latch circuit to which LSPE is inputted corresponds to D_OUTE.

At last, a latch signal LAT and an inverted latch signal LATB are inputted from outside to all the stages of the second latch circuit. In addition, the outputs D_OUT1 to D_OUTE of the first latch circuit are inputted to the respective stages. Outputs of the respective stages of the second latch circuit correspond to LOUT1, LOUT2, . . . in accordance with the signals of D_OUT1, D_OUT2, . . . inputted from the first latch circuit respectively. The output of the latch circuit to which D_OUTE is inputted corresponds to LOUTE.

The data signal DATA among the signals inputted from outside may have an arbitrary signal waveform. It is desirable that the latch signal LAT and the inverted latch signal LATB be such signals that allow the second latch circuit to perform the sampling operation after the LSPE is inputted into the first latch circuit. Note that the latch signal LAT can be generated internally without sampling from outside. In such a case, one more stage of the shift register may be provided so that an output signal thereof may be used as a latch signal.

In addition, since the input timing of a next source start pulse SSP is required to be after the output timing of the second latch circuit, the source start pulse SP is inputted after the sampling operation of the latch signal LAT.

The operation in the timing chart in FIG. 9 is already described in Embodiment 1 and Embodiment 2; therefore, it is omitted here, and the descriptions in Embodiment 1 and Embodiment 2 are to be referred to as required. In addition, since the operation of the NAND circuits is similar to that of a known NAND circuit, description thereon is omitted here.

Note that the source driver circuit shown in this embodiment is only illustrative, and therefore the invention is not limited to this.

This embodiment can be freely implemented in combination with any of the aforementioned embodiment mode and embodiments.

Embodiment 4

Description is made briefly below with reference to FIG. 10 to FIG. 15 on manufacturing steps as an example of manufacturing a thin film transistor over a substrate having an insulating surface with respect to n-channel transistors and p-channel transistors for constructing the semiconductor circuit of the invention. An active matrix display device having a structure shown in FIG. 10 to FIG. 15 can realize a liquid crystal display device or a display device using an OLED (ORGANIC LIGHT EMITTING DIODE) including an EL (Electro Luminescence) element.

First, as shown in FIG. 10(A), a blocking layer 402 made of an insulating film such as a silicon oxide film, a silicon nitride film or a silicon oxynitride film is formed over a glass substrate 401 formed of barium borosilicate glass or alumino borosilicate glass typified by #7059 glass or #1737 glass of Corning, Inc. For example, a silicon oxynitride film made of $SiH_4$, $NH_3$ and $N_2O$ is formed with a thickness of 10 to 200 nm (preferably, 50 to 100 nm) by a plasma CVD method, and similarly a hydrogenated silicon oxynitride film made of $SiH_4$ and $N_2O$ is stacked thereover with a thickness of 50 to 200 nm (preferably, 100 to 150 nm). Although the blocking layer 402 is shown as a two-layer structure in this embodiment, the blocking layer 402 may have a single layer or stacked layers of two or more layers using the aforementioned insulating films.

Semiconductor layers 403 to 406 separated into island shapes are formed by using a semiconductor film having a crystalline structure (hereinafter referred to as a crystalline semiconductor film) that is obtained by crystallizing a semiconductor film having an amorphous structure by a laser annealing method or thermal treatment using an annealing furnace. The island-shape semiconductor layers 403 to 406 are formed with a thickness of 25 to 80 nm (preferably, 30 to 60 nm). Although the material for the crystalline semiconductor film is not limited, it is preferably formed by using silicon or a silicon-germanium (SiGe) alloy.

In order to manufacture a crystalline semiconductor film by the laser annealing method, an excimer laser, a YAG laser or a $YVO_4$ laser of a pulse oscillation type or a continuous oscillation type is used. As an irradiation method, the semiconductor film is irradiated with laser beams outputted from a laser oscillator are condensed into a linear shape with an optical system. The conditions of the annealing are appropriately selected by a practitioner. In the case of using the excimer laser, the pulse repetition rate is set to 30 Hz and the laser energy density is set to 100 to 400 $mJ/cm^2$ (typically, 200 to 300 $mJ/cm^2$). In the case of using the YAG laser, a second harmonic is used, the pulse repetition rate is set to 1 to 10 kHz and the laser energy density is set to 300 to 600 $mJ/cm^2$ (typically, 350 to 500 $mJ/cm^2$). Then, the entire surface of the substrate is irradiated with laser beams that have been condensed into a linear shape with a width of 100 to 1000 μm, for example 400 μm. The overlapped ratio of the linear laser beams at this time is set to 80 to 98%.

Then, a gate insulating film 407 is formed covering the island-shape semiconductor layers 403 to 406. The gate insulating film 407 is formed with a thickness of 40 to 150 nm by a plasma CVD method or a sputtering method by using an insulating film containing silicon. In this embodiment, a silicon oxynitride film is formed with a thickness of 120 nm. Needless to say, the gate insulating film 407 is not limited to such a silicon oxynitride film, and other insulating films containing silicon may be used in a single layer or stacked layers.

Then, a first conductive film 408a and a second conductive film 408b are formed to form gate electrodes over the gate insulating film 407. In this embodiment, the first conductive film 408a is formed of tantalum nitride or titanium with a thickness of 50 to 100 nm, while the second conductive film 408b is formed of tungsten with a thickness of 100 to 300 nm. These materials are stable even under the thermal treatment of 400 to 600° C. in a nitrogen atmosphere, and there is no such concern that the resistivity is considerably increased.

Then, as shown in FIG. 10(B), a resist mask 409 is formed, and first etching treatment for forming gate electrodes is performed. Although the etching is not limited to a particular method, an ICP (Inductively Coupled Plasma) etching method is preferably used. The etching is performed by mixing $CF_4$ and $Cl_2$ as an etching gas, and generating plasma by supplying RF (13.56 MHz) power of 500 W to a coiled electrode with a pressure of 0.5 to 2 Pa, or preferably 1 Pa. RF (13.56 MHz) power of 100 W is also supplied to a substrate side (sample stage), and substantially a negative self-biasing voltage is applied thereto. In the case of mixing $CF_4$ and $Cl_2$, etching can be performed at about the same speed in any case of using a tungsten film, tantalum nitride film and a titanium film.

By the aforementioned etching conditions, end portions can have tapered shapes due to the shape of the resist mask and an effect of a bias voltage applied to the substrate side. The tapered portions are controlled to have an angle of 25 to 45 degrees. In order to perform etching without leaving a residue on the gate insulating film, the etching time is preferably increased by about 10 to 20%. The selection ratio of the silicon oxynitride film relatively to tungsten is 2 to 4 (typically, 3); therefore, an exposed surface of the silicon oxynitride film is etched by about 20 to 50 nm by overetching treatment. In this manner, first-shape conductive layers 410 to 415 are formed, which are formed by the first etching treatment and includes the first conductive films and the second conductive films (first conductive films 410a to 415a and second conductive films 410b to 415b). Reference numeral 416 is a gate insulating film, of which region that is not covered with the first-shape conductive layers is etched by about 20 to 50 nm, and thus becomes thin.

Then, as shown in FIG. 10(C), first doping treatment is performed and n-type impurities (donors) are added. The doping is performed by an ion doping method or an ion implantation method. As a condition of the ion doping method, the dosage is set to $1\times10^{13}$ to $5\times10^{14}/cm^2$. As the impurity elements that impart n-type conductivity, elements belonging to the group 15, typically phosphorus (P) or arsenic (As) is used. In this case, the first-shape conductive layers are used as masks while controlling the acceleration voltage (for example, 20 to 60 keV). In this manner, first impurity regions 417 to 420 are formed. For example, the first impurity regions 417 to 420 are formed with an n-type impurity concentration in the range of $1\times10^{20}$ to $1\times10^{21}/cm^3$.

Second etching treatment shown in FIG. 11(A) is similarly performed by using an ICP etching apparatus, mixing $CF_4$, $Cl_2$ and $O_2$ as an etching gas, and generating plasma by supplying RF power (13.56 MHz) of 500 W to a coiled electrode with a pressure of 1 Pa. RF (13.56 MHz) power of 50 W is also supplied to a substrate side (sample stage), and a self-biasing voltage that is lower than that of the first etching treatment is applied thereto. In accordance with such conditions, the tungsten film is anisotropically etched so that the tantalum nitride film or the titanium film as a first conductive layer is kept remained. In this manner, second-shape conductive layers 421 to 426 (first conductive films 421a to 426a and second conductive films 421b to 426b) are formed. A region of the gate insulating film that is not covered with the second-shape conductive layers 421 to 426 are etched by about 20 to 50 nm, and thus becomes thin.

Then, second doping treatment is performed. The dosage is set lower than that in the first doping treatment, and n-type impurities (donors) are added with a condition of a high acceleration voltage. For example, doping is performed with an acceleration voltage of 70 to 120 keV, and a dosage of $1\times10^{13}/cm^2$, so that second impurity regions 427 to 430 are formed at the interior side of the first impurity regions that are formed in the island-shape semiconductor layers in FIG. 4(C). This doping is performed in such a manner that impurity elements are added onto regions below the second-shape conductive layers 423a to 426a by using as masks the second-shape conductive layers 423b to 426b. The impurity regions have a small difference in concentration distribution in the direction along the second-shape conductive layers 423a to 426a since the second-shape conductive layers remain with about the same thickness, and specifically, the impurity regions are formed to contain n-type impurities (donors) with a concentration of $1\times10^{17}$ to $1\times10^{19}/cm^3$.

Then, as shown in FIG. 11(B), third etching treatment is performed to etch the gate insulating film. As a result, the second-shape conductive layers 421a to 426a are also etched to have smaller end portions, thereby third-shape conductive layers 431 to 436 (first conductive films 431a to 436a and second conductive films 431b to 436b) are formed. Reference numeral 437 denotes a remaining gate insulating film. The etching may be performed to further degree so as to expose the surface of the semiconductor layers.

With respect to the p-channel TFTs, resist masks 438 and 439 are formed as shown in FIG. 11(C), and the island-shape semiconductor layers for forming the p-channel TFTs are doped with p-type impurities (acceptors). The p-type impurities (acceptors) are selected from elements belonging to the group 13, and typically boron (B) is used. Third impurity regions 440a to 440c are controlled to have an impurity concentration of $2\times10^{20}$ to $2\times10^{21}/cm^3$. Although the third impurity regions are doped with phosphorus, it is further doped with boron at an equal or higher concentration to invert the conductivity type.

Through the aforementioned steps, the impurity regions are formed in the semiconductor layers. In FIG. 11, the third-shape conductive layers 433 to 435 function as gate electrodes while the third-shape conductive layer 436 functions as a capacitive wire. In addition, the third-shape conductive layers 431 and 432 form wires such as source lines.

Figure 12A:
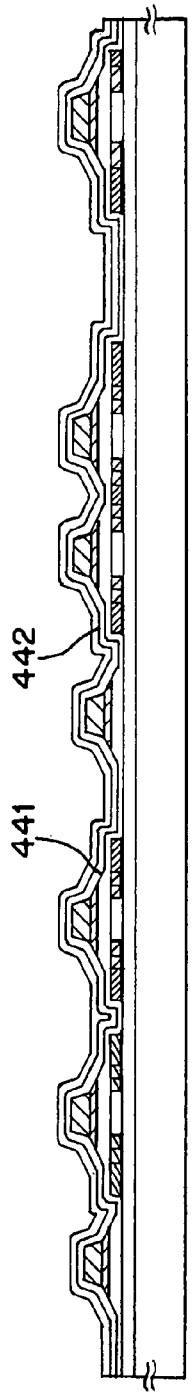
FIGS. 12(a)-12(b) are cross-sectional views showing the manufacturing steps of transistors in Embodiment 4.

Then, in FIG. 12(A), a first insulating film 441 made of a silicon nitride film (SiN:H) or a silicon oxynitride film ($SiN_xO_y$:H) is formed by a plasma CVD method. Then, a step for activating the impurity elements added into the respective island-shape semiconductor layers is performed so as to control the conductivity type. The activation is preferably performed by a thermal annealing method using an annealing furnace. Alternatively, a laser annealing method or a rapid thermal annealing method (RTA method)

can be used. The thermal annealing method is performed at 400 to 700° C., or typically 500 to 600° C. with an oxygen concentration of 1 ppm or lower, or preferably in a nitrogen atmosphere of 0.1 ppm or lower. In this embodiment, thermal treatment is performed at 550° C. for 4 hours.

After that, a second insulating film 422 made of a silicon nitride film (SiN:H) or a silicon oxynitride film ($SiN_xO_y$:H) is formed over the first insulating film 441. Then, thermal treatment is performed at 350 to 500° C. With the hydrogen discharged from the second insulating film 442, the semiconductor films are hydrogenated.

Figure 12B:
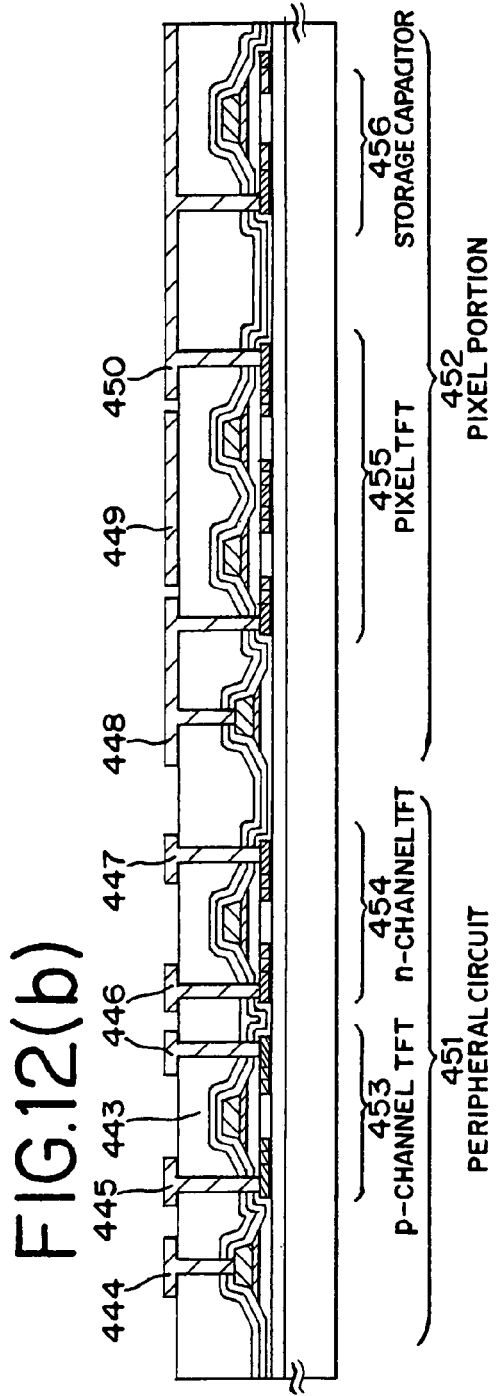

Further, a third insulating film 443 made of an organic resin is formed with a thickness of about 1000 nm as shown in FIG. 12(B). As the organic resin film, polyimide, acrylic, polyimide amide or the like can be used. The organic resin film has advantages in that a film deposition method is easy to perform; parasitic capacitance can be reduced because of the low dielectric constant; high planarity is ensured; and the like. Note that organic resin films other than the aforementioned can be used. Here, polyimide of a thermopolymerization type is applied onto the substrate, and then baked at 300° C.

Next, contact holes are formed in the third insulating film 443, the second insulating film 442 and the first insulating film 441 so as to form a connecting electrode 451 and source or drain wires 444 to 447 by using aluminum (Al), titanium (Ti), tantalum (Ta) or the like. In a pixel portion, a first pixel electrode 450, a gate wire 449 and a connecting electrode 448 are formed.

In this manner, a p-channel TFT 453 and an n-channel TFT 454 are formed over the same substrate. Although FIG. 12(B) only shows a cross-sectional view of the p-channel TFT 453 and the n-channel TFT 454, these TFTs can be used to integrally form a gate signal line driver circuit and source signal line driver circuit each having the semiconductor circuit of the invention over the same substrate.

The structure of the thin film transistors described in this embodiment is only exemplary; therefore, the invention is not limited to the manufacturing steps and structure shown in FIGS. 10 to 15. The semiconductor circuit of the invention can be integrally formed over the same substrate by a known manufacturing method of a thin film transistor. Since such a circuit can be formed over a large substrate such as a glass substrate at low cost by using thin film transistors, a larger area and lower cost of a display device can be achieved. Further, since a gate signal line driver circuit and a source signal line driver circuit each having the semiconductor circuit of the invention can have a drastically reduced number of transistors, the layout area of a driver circuit portion around the pixel portion can be reduced as well as products can be manufactured with a high yield.

This embodiment can be freely implemented in combination with any of the aforementioned embodiment mode and embodiments.

Embodiment 5

In this embodiment, description is made on steps of manufacturing an active matrix liquid crystal display device by using an active matrix substrate. As shown in FIG. 13, interlayer films 461 and 462 are formed over the substrate with the condition of FIG. 12(B), and a second pixel electrode 463 is formed thereover. Then, an alignment film 551 is formed thereover. In this embodiment, a polyimide film is used as the alignment film. Over a counter substrate 552, a transparent conductive film 553 and an alignment film 554 are formed. Note that a color filter or a light-shielding film may be formed over the counter substrate as required.

Then, after forming the alignment film, it is subjected to rubbing treatment so that liquid crystal molecules can be adjusted to be aligned with a predetermined pretilt angle. Then, the active matrix substrate over which the pixel portion and the driver circuit are formed is attached to the counter substrate by using a sealant, a spacer (neither of them is shown) and the like through a known cell assembling step.

After that, a liquid crystal 555 is injected between the both substrates and it is completely sealed with a sealant (not shown). Known liquid crystal materials may be used for the liquid crystal. In this manner, the active matrix display device shown in FIG. 5 is completed.

Next, description is made with reference to a perspective view of FIG. 14 on the structure of the active matrix liquid crystal liquid crystal display device. An active matrix substrate is constructed of a pixel portion 602, a gate line driver circuit 603 and a source line driver circuit 604 formed over a glass substrate 601. A pixel TFT 605 in the pixel portion is an n-channel TFT and connected to a pixel electrode 606 and a storage capacitor 607.

In addition, the driver circuits formed on the periphery are formed by using as a unit the semiconductor circuit of the invention. The gate side driver circuit 603 and the source side driver circuit 604 are respectively connected to the pixel portion 602 through a gate wire 608 and a source wire 609. An external input/output terminal 611 to which an FPC 610 is connected is provided with input/output wires (connecting wires) 612 and 613 for transmitting signals to the driver circuits. In addition, reference numeral 614 is a counter substrate.

The structure of the active matrix liquid crystal display device described in this embodiment is only exemplary; therefore, the invention is not limited to the structure shown in FIG. 13 and FIG. 14. The semiconductor circuit of the invention can be mounted on a driver circuit portion of the active matrix liquid crystal display device by a known manufacturing method of an active matrix liquid crystal display device. Since the active matrix liquid crystal display device having the semiconductor circuit of the invention can be formed over a large substrate such as a glass substrate at low cost by using thin film transistors, a larger area and lower cost of the display device can be achieved. Further, since a gate signal line driver circuit and a source signal line driver circuit each having the semiconductor circuit of the invention can have a drastically reduced number of transistors, low power consumption can be achieved and the layout area of a driver circuit portion around the pixel portion can be reduced, thereby reduction of a frame width can be achieved as well as products can be manufactured with a high yield.

Note that although the semiconductor device shown in FIG. 13 is called an active matrix liquid crystal display device in this specification, a liquid crystal panel to which an FPC is connected as shown in FIG. 14 is generally called a liquid crystal module. Accordingly, the active matrix liquid crystal display device in this embodiment may be called a liquid crystal module.

This embodiment can be freely implemented in combination with any of the aforementioned embodiment mode and embodiments.

Embodiment 6

In this embodiment, description is made with reference to FIG. 15 on an external view of a panel corresponding to one mode of a light-emitting device having the semiconductor circuit of the invention. FIG. 15(A) is a top view of a panel where transistors and light-emitting elements formed over a first substrate are sealed between the first substrate and a second substrate with a sealant, and FIG. 15(B) is a cross-sectional view along A-A' of FIG. 15(A).

A sealant 4020 is formed to surround a pixel portion 4002, a signal line driver circuit 4003, a first scan line driver circuit 4004 and a second scan line driver circuit 4005 that are provided over a first substrate 4001. In addition, a second substrate 4006 is provided over the pixel portion 4002, the signal line driver circuit 4003, the first scan line driver circuit 4004 and the second scan line driver circuit 4005. Accordingly, the pixel portion 4002, the signal line driver circuit 4003, the first scan line driver circuit 4004 and the second scan line driver circuit 4005 are tightly sealed together with a filling material 4007 by the first substrate 4001, the sealant 4020 and the second substrate 4006.

The pixel portion 4002, the signal line driver circuit 4003, the first scan line driver circuit 4004 and the second scan line driver circuit 4005 provided over the first substrate 4001 include multiple transistors. FIG. 15(B) illustrate a transistor 4008 included in the signal line driver circuit 4003, and a driving transistor 4009 and a switching transistor 4010 included in the pixel portion 4002.

Reference numeral 4011 corresponds to a light-emitting element, and a part of a wire 4017 connected to a drain of the driving transistor 4009 functions as a first electrode of the light-emitting element 4011. In addition, a transparent conductive film functions as a second electrode 4012 of the light-emitting element 4011. The structure of the light-emitting element 4011 is not limited to the one shown in this embodiment. The structure of the light-emitting element 4011 may be appropriately changed in accordance with the direction of light extracted from the light-emitting element 4011, polarity of the driving transistor 4009 and the like.

Various signals and voltages supplied to the signal line driver circuit 4003, the first scan line driver circuit 4004, the second scan line driver circuit 4005 or the pixel portion 4002 are supplied from a connecting terminal 4016 through lead wires 4014 and 4015 though not shown in the cross-sectional view shown in FIG. 15(B).

In this embodiment, the connecting terminal 4016 is formed of the same conductive film as the second electrode 4012 of the light-emitting element 4011. In addition, the lead wire 4014 is formed of the same conductive film as the wire 4017. The lead wire 4015 is formed of the same conductive film as the gates of the driving transistor 4009, the switching transistor 4010 and the transistor 4008.

The connecting terminal 4016 is electrically connected to a terminal of an FPC 4018 through an anisotropic conductive film 4019.

Note that the first substrate 4001 and the second substrate 4006 can be formed by using glass, metal (typically, stainless steel), ceramic or plastic. As the plastic, an FRC (Fiberglass-Reinforced Plastics) plate, a PVF (polyvinyl fluoride) film, a mylar film, a polyester film or an acrylic resin film can be used. Alternatively, a sheet having such a structure that aluminum foil is sandwiched between a PVF film or a mylar film can be used.

Note that the second substrate 4006 positioned in the direction for extracting light from the light-emitting element 4011 is required to transmit light. Therefore, the second substrate 4006 is formed by using a glass substrate, a plastic substrate, a polyester film or an acrylic resin film.

As the filling material 4007, an inert gas such as nitrogen or argon can be used as well as an ultraviolet curable resin or a heat curable resin such as PVC (polyvinyl chloride), acrylic, polyimide, epoxy resin, silicone resin, PVB (polyvinyl butyral) or EVA (ethylene vinyl acetate). In this embodiment, nitrogen is used as the filling material.

The driver circuits provided on the periphery are formed by using as a unit the semiconductor circuit of the invention. The first scan line driver circuit 4004, the second scan line driver circuit 4005 and the signal line driver circuit 4003 are each connected to the pixel portion through gate wires or source wires.

This embodiment can be freely implemented in combination with any of the aforementioned embodiment mode and embodiments.

The structure of the light-emitting display device described in this embodiment is only exemplary; therefore, the invention is not limited to the structure shown in FIG. 15. The semiconductor circuit of the invention can be mounted on a driver circuit portion of the light-emitting device by a know manufacturing method of a light-emitting device. Since the light-emitting device having the semiconductor circuit of the invention can be formed over a large substrate such as a glass substrate at low cost by using thin film transistors, a larger area and lower cost of a display device can be achieved. Further, since a gate signal line driver circuit and a source signal line driver circuit each having the semiconductor circuit of the invention can have a drastically reduced number of transistors, low power consumption can be achieved and the layout area of a driver circuit portion around the pixel portion can be reduced, thereby reduction of a frame width can be achieved as well as products can be manufactured with a high yield.

Note that although the semiconductor device shown in FIG. 15 is called an active matrix light-emitting device in this specification, a panel using an OLED (EL) element to which an FPC is connected as shown in FIG. 15 is called an OLED (EL) module in this specification.

This embodiment can be freely implemented in combination with any of the aforementioned embodiment mode and embodiments.

Embodiment 7

An example is shown below on manufacturing an n-channel transistor and a p-channel transistor for constructing a semiconductor circuit of the invention over a single crystalline substrate. The manufacture procedure is briefly described with reference to FIG. 16.

First, a silicon substrate 1901 formed of single crystalline silicon is prepared. In a first element forming region over a main surface of the silicon substrate (over an element forming region or a circuit forming region) and a second element forming region thereof, an n-type well 1902 and a p-type well 1903 are selectively formed respectively.

Then, a field oxide film 1904 to serve as an element isolation region for separating the first element forming region and the second element forming region is formed. The field oxide film 1904 is a thick thermal oxide film, and may be formed by a known LOCOS method. Note that the element isolation method is not limited to the LOCOS method, and for example, the element isolation region may have a trench structure by using a trench isolation method or may have a combination of the LOCOS structure and the trench structure.

Then, a gate insulating film is formed by, for example thermally oxidizing the surface of the silicon substrate. The gate insulating film may be formed by a CVD method and can be formed and by using a silicon oxynitride film, a silicon oxide film, a silicon nitride film, or a stacked film thereof. For example, a stacked film is formed by stacking a silicon oxide film with a thickness of 5 nm obtained by thermal oxidation and a silicon oxynitride film with a thickness of 10 to 15 nm obtained by a CVD method.

Then, stacked films of polysilicon layers 1905b and 1906b and silicide layers 1905a and 1906a are formed over the entire surface to form stacked films based on a lithography technique and a dry etching technique, thereby forming gate electrodes 1905 and 1906 having a polycide structure over the gate insulating film. The polysilicon layers 1905b and 1906b may be doped with phosphorus (P) in advance at a concentration of about $10^{21}/cm^3$ in order to lower the resistivity, or n-type impurities may be diffused with high concentration after forming the polysilicon films. The silicide layers 1905a and 1906a may be formed by using molybdenum silicide ($MoSi_x$), tungsten silicide ($WSi_x$), tantalum silicide ($TaSi_x$), titanium silicide ($TiSi_x$) or the like and may be formed by a known method.

Then, ion implantation is performed to the silicon semiconductor substrate through the gate insulating film in order to form extension regions. In this embodiment, an impurity region formed between each of the source and drain regions and the channel forming region is called an extension region. There are cases where extension regions 1907 and 1908 may have an impurity concentration that is lower, equal to, or higher than the source regions and drain regions. That is, the impurity concentration of the extension regions may be determined based on the characteristics required for the semiconductor device.

This embodiment illustrates a case for manufacturing a CMOS circuit applied to the invention; therefore, the first element forming region for forming a p-channel FET is covered with a resist material, and arsenic (As) or phosphorus (P) as an n-type impurity is injected into the silicon substrate. In addition, the second element forming region for forming an n-channel FET is covered with a resist material, and boron (B) as a p-type impurity is injected into the silicon substrate.

Then, first activation treatment is performed for activating the ion-implanted impurities and for recovering crystal defects in the silicon substrate that have been generated by the ion implantation. The activation is performed by heating the semiconductor substrate up to a temperature of around the melting point of Si.

Then, sidewalls 1909 and 1910 are formed on opposite side walls of the gate electrodes. For example, the sidewalls may be formed by stacking an insulating material layer made of silicon oxide over the entire surface by a CVD method, and then performing etch back to the insulating material layer. In performing the etch back, the gate insulating film may be selectively removed in a self-aligning manner. In addition, etching of the gate insulating film may be performed after the etch back. In this manner, gate insulating films 1911 and 1912 are formed, each of which has an equal width to a total width of the gate electrode and the sidewalls provided on the opposite side walls of the gate electrode.

Then, ion implantation is performed to the exposed silicon substrate in order to form source regions and drain regions. The first element forming region for forming a p-channel FET is covered with a resist material, and arsenic (As) or phosphorus (P) as an n-type impurity is injected into the silicon substrate, thereby forming a source region 1913 and a drain region 1914. In addition, the second element forming region for forming an n-channel FET is covered with a resist material, and boron (B) as a p-type impurity is injected into the silicon substrate, thereby forming a source region 1915 and a drain region 1916.

Then, second activation treatment is performed for activating the ion-implanted impurities and for recovering crystal defects in the silicon substrate that have been generated by the ion implantation.

After the activation, an interlayer insulating film, a plug electrode, a metal wire and the like are formed. A first interlayer insulating film 1917 is formed with a thickness of 100 to 2000 nm by a plasma CVD method or a low pressure CVD method by using a silicon oxide film, a silicon oxynitride film or the like. Then, a second interlayer insulating film 1918 is formed thereover by using phosphorus glass (PSG), boron glass (BSG) or phosphorus boron glass (PBSG). The second interlayer insulating film 1918 is manufactured by a spin coating method or a normal pressure CVD method in order to increase the planarity.

Source electrodes 1919 and 1921 and drain electrodes 1920 and 1922 are formed after forming contact holes in the first interlayer insulating film 1917 and the second interlayer insulating film 1918 to reach the source regions and the drain regions of the respective FETs, and preferably formed by using aluminum (Al) that is often used as a low-resistance material in general. Alternatively, a stacked structure of Al and titanium (Ti) may be used.

In addition, though not shown in the drawing, a contact hole is provided in the first interlayer insulating film 1917 and the second interlayer insulating film 1918 to reach the gate electrode, so that an electrode is formed to bed electrically connected to a wire provided on the first interlayer insulating film.

Finally, a passivation film 1923 and a third interlayer insulating film 1924 are formed. In FIG. 16, the left side corresponds to a p-channel transistor 1925 while the right side corresponds to an n-channel transistor 1926.

The passivation film 1923 is formed by a plasma CVD method by using a silicon nitride film, a silicon oxide film or a silicon nitride oxide film. Further, the third interlayer insulating film 1924 is formed with a thickness of 1 to 2 μm by using an organic resin material. As the organic resin material, polyimide, polyamide, acrylic, benzocyclobutene (BCB) or the like can be used. What is advantageous in using an organic resin film is that the film formation method is easy, parasitic capacitance can be lowered since a relative dielectric constant is low, and therefore it is suitable for planarization. Needless to say, an organic resin film other than the aforementioned can be used.

In this manner, the p-channel transistor 1925 and the n-channel transistor 1926 are completed. The structure of the transistors described in this embodiment is only exemplary; therefore, the invention is not limited to the manufacturing steps and structure shown in FIG. 17. The semiconductor circuit of the invention can be formed over a single crystalline substrate by a known manufacturing method of transistors over a single crystalline substrate. Such a circuit can operate at first speed by being formed over a single crystalline substrate, and further a driving voltage can be lowered to reduce power consumption. Further, since a gate signal line driver circuit and a source signal line driver circuit each having the semiconductor circuit of the invention can have a drastically reduced number of transistors, the layout area of a driver circuit portion around the pixel portion can be reduced as well as products can be manufactured with a high yield.

Embodiment 8

As an electronic apparatus having the semiconductor circuit of the invention, there are a television receiver, a video camera, a digital camera, a goggle display, a navigation system, an audio reproducing device (e.g., a car audio component set), a computer, a game machine, a portable information terminal (e.g., a mobile computer, a portable phone, a portable game machine, or an electronic book), an image reproducing device provided with a recording medium (specifically, a device for reproducing a recording medium such as a Digital Versatile Disc (DVD) and having a display portion for displaying the reproduced image), and the like. Specific examples of such electronic apparatuses are shown in FIG. 17, FIG. 18, FIG. 19(A), FIG. 19(B), FIG. 20(A), FIG. 20(B), FIG. 21, and FIG. 22(A) to FIG. 22(E).

FIG. 17 shows a liquid crystal module constructed by combining a display panel 5001 and a circuit board 5011. Over the circuit board 5011, a control circuit 5012, a signal dividing circuit 5013 and the like are formed, which are electrically connected to the display panel 5001 through a connecting wire 5014.

The display panel 5001 has a pixel portion 5002 where multiple pixels are provided, a scan line driver circuit 5003, and a signal line driver circuit 5004 for supplying a video signal to a selected pixel. Note that in the case of manufacturing a liquid crystal module, the display panel 5001 may be manufactured by using the aforementioned embodiments. In addition, a control driver circuit portion such as the scan line driver circuit 5003 and the signal line driver circuit 5004 can be manufactured by using thin film transistors formed in accordance with the aforementioned embodiments or transistors over a single crystalline substrate. In this manner, a liquid crystal television with the liquid crystal module shown in FIG. 17 can be completed.

Figure 18:
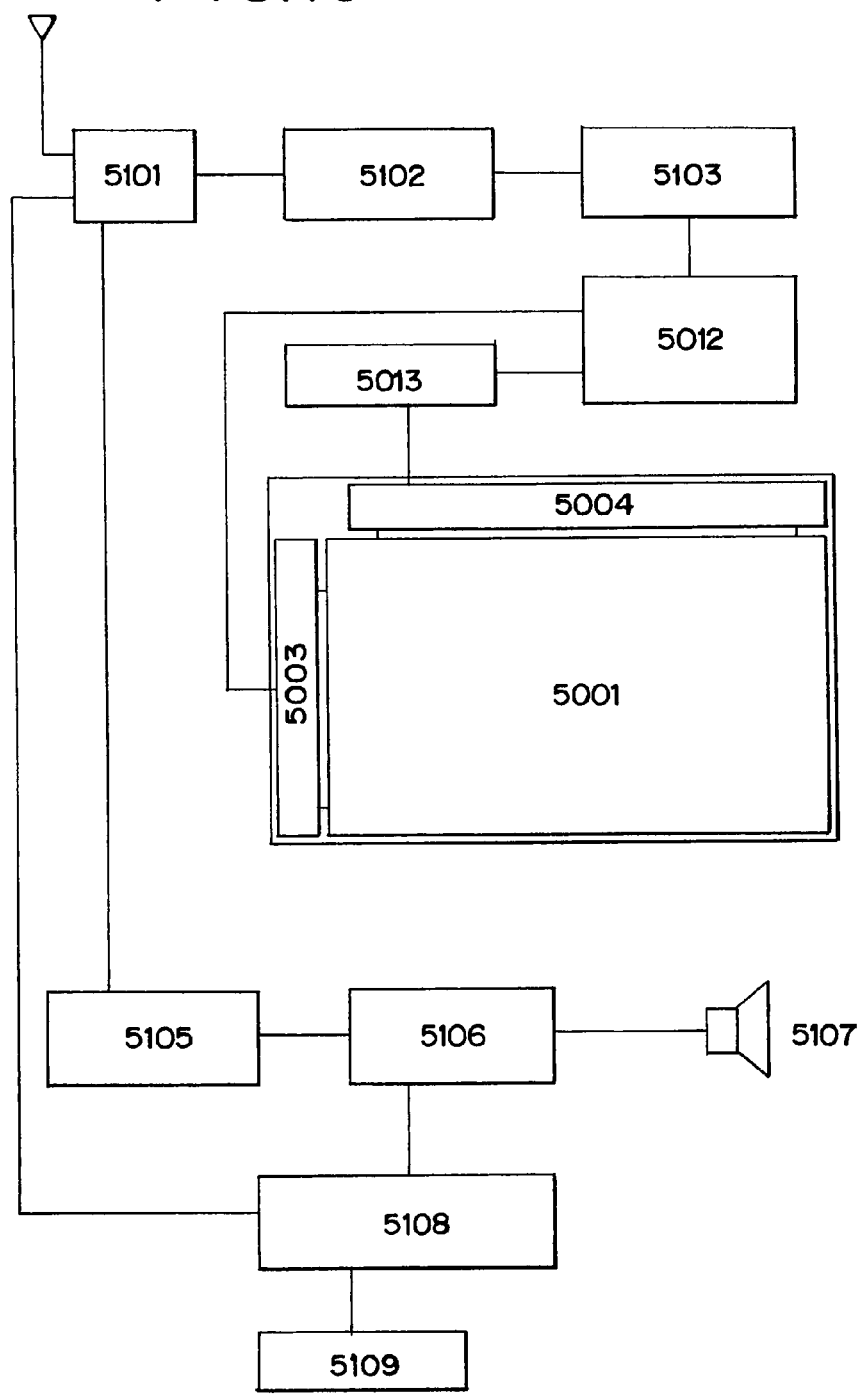
FIG. 18 is a view showing an example of an electronic apparatus to which the invention is applied.

FIG. 18 is a block diagram showing the main configuration of a liquid crystal television receiver. A tuner 5101 receives video signals and audio signals. The video signals are processed by a video signal amplifying circuit 5102, a video signal processing circuit 5103 for converting the output signals from 5102 to color signals corresponding to the respective colors of red, green and blue, and the control circuit 5012 for converting the video signals to be inputted to a driver IC. The control circuit 5012 outputs signals to each of a scan line side and a signal line side. When performing digital drive, the signal dividing circuit 5013 may be provided on the signal line side so that the inputted digital signal is divided into m signals to be supplied.

Among the signals received at the tuner 5101, audio signals may be transmitted to the audio signal amplifying circuit 5105, and an output thereof is supplied to a speaker 5107 through an audio signal processing circuit 5106. A control circuit 5108 receives control data on the receiving station (receive frequency) and volume from an input portion 5109, and transmits the signal to the tuner 5101 and the audio signal processing circuit 5106.

Figure 19A:
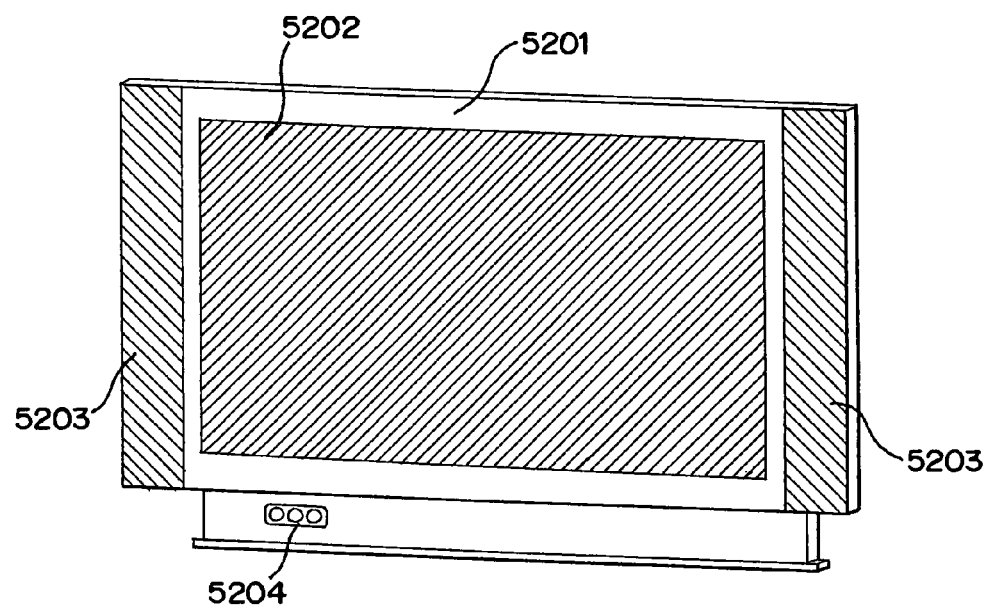
FIGS. 19(a)-19(b) are views showing examples of an electronic apparatus to which the invention is applied.

As shown in FIG. 19(A), a television receiver can be completed by incorporating a liquid crystal module into a housing 5201. A display screen 5202 is formed by the liquid crystal module. In addition, speakers 5203, an operating switch 5204 and the like are appropriately provided.

Figure 19B:
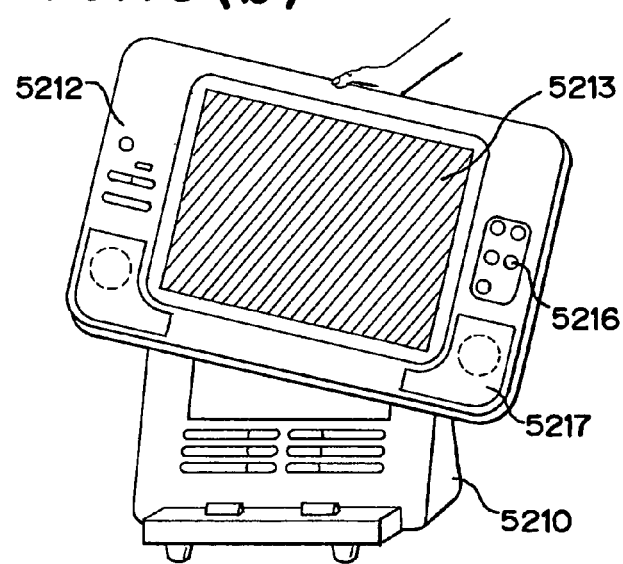

FIG. 19(B) shows a television receiver only a display of which is wireless and portable. A housing 5212 is incorporated with a battery and a signal receiver, and the battery drives a display portion 5213 and a speaker portion 5217. The battery can be repeatedly charged with a battery charger 5210. In addition, the battery charger 5210 can transmit and receive video signals, and transmit the video signals to the signal receiver of the display. The housing 5212 is controlled with an operating key 5216. The device shown in FIG. 19(B) can also transmit signals from the housing 5212 to the battery charger 5210 by operating the operating key 5216; therefore, it can also be called a video/audio two-way communication device. In addition, the device can also perform communication control of other electronic apparatuses by operating the operating key 5215 to transmit signals from the housing 5212 to the battery charger 5210 and further by controlling the other electronic apparatuses to receive signals that the battery charger 5210 can transmit; therefore, the device can also be called a general-purpose remote control device. The invention can be applied to the scan line driver circuit 5003 and the signal line driver circuit 5004.

By applying the invention to the television receivers shown in FIG. 17, FIG. 18, FIG. 19(A) and FIG. 19(B), the number of transistors for the gate signal line driver circuit and the source signal line driver circuit can be drastically reduced; therefore, the layout area of a driver circuit portion around the pixel portion can be reduced as well as a high-yield product can be provided to customers.

Needless to say, the invention is not limited to a television receiver, and can be applied to various objects such as a monitor of a personal computer, an information display board at the train station or airport, or a large-area advertising display medium such as an advertising display board on the streets.

Figure 20A:
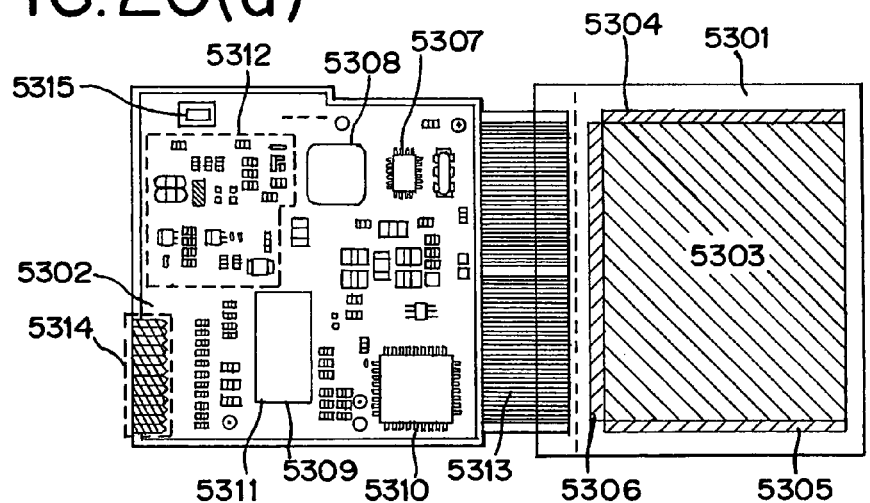
FIGS. 20(a)-20(b) are views showing an example of an electronic apparatus to which the invention is applied.

FIG. 20(A) shows a module constructed by combining a display panel 5301 and a printed wiring board 5302. The display panel 5301 has a pixel portion 5303 where multiple pixels 5303 are provided, a first scan line driver circuit 5304, a second scan line driver circuit 5305, and a signal line driver circuit 5306 for supplying a video signal to a selected pixel.

The printed wiring board 5302 is provided with a controller 5307, a central processing unit (CPU) 5308, a memory 5309, a power supply circuit 5310, an audio processing circuit 5311, a transmission/reception circuit 5312 and the like. The printed wiring board 5302 and the display panel 5301 are connected through a flexible wiring board (FPC) 5313. The printed wiring board 5313 may be provided with a capacitor, a buffer circuit and the like in order to prevent noise interruption on the power supply voltage or signals and also to prevent dull signal rising. In addition, the controller 5307, the audio processing circuit 5311, the memory 5309, the CPU 5308, the power supply circuit 5310 and the like can be mounted on the display panel 5301 by using a COG (Chip On Glass) method. By the COG method, a scale of the printed wiring board 5302 can be reduced.

Various control signals are inputted/outputted through an interface (I/F) portion 5314 provided on the printed wiring board 5302. In addition, an antenna port 5315 for transmitting/receiving signals to/from an antenna is provided on the printed wiring board 5302.

Figure 20B:
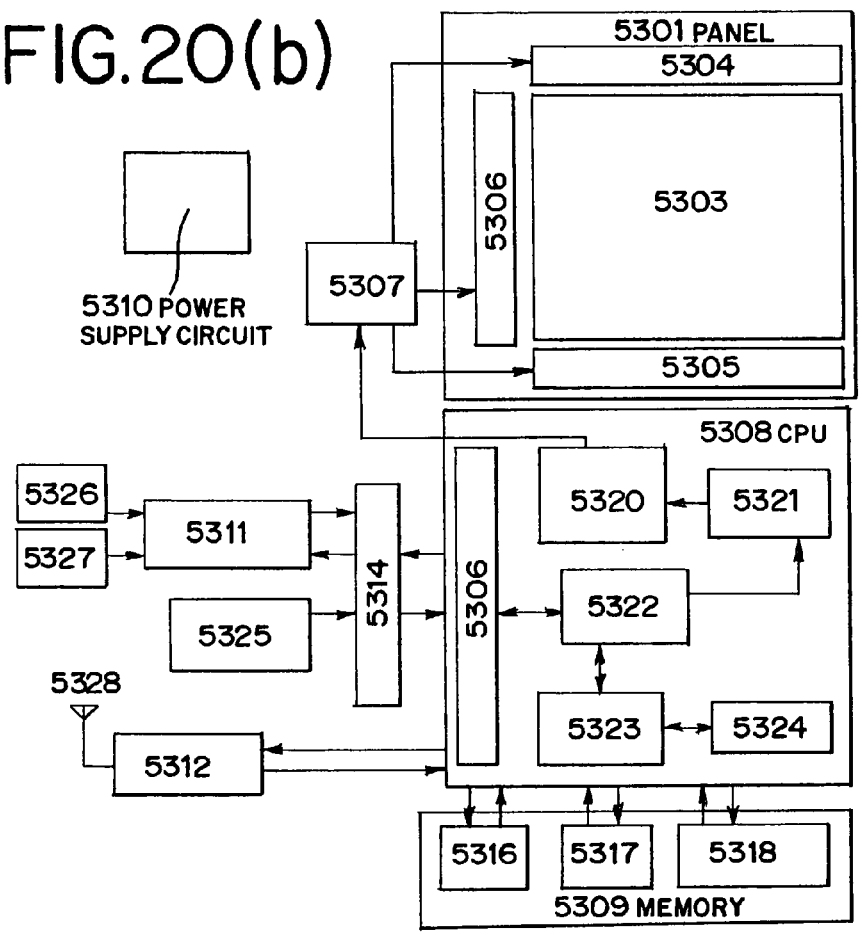

FIG. 20(B) is a block diagram of the module shown in FIG. 20(A). This module includes a VRAM 5316, a DRAM 5317, a flash memory 5318 and the like as the memory 5309. The VRAM 5316 stores image data to be displayed on the panel, the DRAM 5317 stores image data or audio data, and the flash memory stores various programs.

The power supply circuit 5310 supplies power to operate the display panel 5301, the controller 5307, the CPU 5308, the audio processing circuit 5311, the memory 5309 and the transmission/reception circuit 5312. Depending on the specification of the panel, the power supply circuit 5310 may be provided with a current source.

The CPU 5308 includes a control signal generation circuit 5320, a decoder 5321, a register 5322, an arithmetic circuit 5323, a RAM 5324, an interface 5319 for the CPU 5308 and the like. Various signals inputted to the CPU 5308 through the interface 5319 are once stored in the register 5322 before inputted to the arithmetic circuit 5323, the decoder 5321 and the like. The arithmetic circuit 5323 performs operation based on the signals inputted, and specifies an address for sending various instructions. On the other hand, signals inputted to the decoder 5321 are decoded, and inputted to the control signal generation circuit 5320. The control signal generation circuit 5320 generates signals containing various instructions based on the signals inputted, and transmits them to an address specified in the arithmetic circuit 5323, specifically such as the memory 5309, the transmission/reception circuit 5312, the audio processing circuit 5311, the controller 5307 and the like.

The memory 5309, the transmission/reception circuit 5312, the audio processing circuit 5311, and the controller 5307 operate in accordance with the respective instructions received.

The operation is described briefly below.

Signals inputted from an input means 5325 are transmitted to the CPU 5308 mounted on the printed wiring board 5302 through the I/F portion 5314. The control signal generation circuit 5320 converts image data stored in the VRAM 5316 into a predetermined format in accordance with signals transmitted from the input means 5325 such as a pointing device and a keyboard, and then transmits the data to the controller 5307.

The controller 5307 performs data processing on signals containing image data that are transmitted from the CPU 5308 in accordance with the specification of the panel, and then supplies the data to the display panel 5301. In addition, the controller 5307 generates Hsync signals, Vsync signals, clock signals CLK, AC voltage (AC Cont), and switching signals L/R based on the power supply voltage inputted from the power supply circuit 5310 and the various signals inputted from the CPU 5308, and supplies them to the display panel 5301.

The transmission/reception circuit 5312 processes signals that have been transmitted/received as electromagnetic waves at an antenna 5328, and specifically includes high frequency circuits such as an isolator, a bandpass filter, a VCO (Voltage Controlled Oscillator), an LPF (Low Pass Filter), a coupler and a balun. Among signals transmitted/received to/from the transmission/reception circuit 5312, signals containing audio data are transmitted to the audio processing circuit 5311 in accordance with the instruction from the CPU 5308.

The signals containing audio data that are transmitted in accordance with the instruction from the CPU 5308 are demodulated into audio signals in the audio processing circuit 5311 and then transmitted to a speaker 5327. Audio signals transmitted from a microphone 5326 are modulated in the audio processing circuit 5311, and then transmitted to the transmission/reception circuit 5312 in accordance with the instruction from the CPU 5308.

The controller 5307, the CPU 5308, the power supply circuit 5310, the audio processing circuit 5311, and the memory 5309 can be integrated as a package of this embodiment. This embodiment can be applied to any circuits except high frequency circuits such as an isolator, a bandpass filter, a VCO (Voltage Controlled Oscillator), an LPF (Low Pass Filter), a coupler and a balun.

FIG. 21 shows one mode of a portable phone including the module shown in FIG. 20(A) and FIG. 20(B). The display panel 5301 can be incorporated into a housing 5330 in an attachable/detachable manner. The shape and size of the housing 5330 can be appropriately changed in accordance with the size of the display panel 5301. The housing 5330 to which the display panel 5301 is fixed is fit into a printed board 5331 so as to be assembled as a module.

The display panel 5301 is connected to the printed board 5331 through an FPC 5313. On the printed board 5331, a speaker 5332, a microphone 5333, a transmission/reception circuit 5334, and a signal processing circuit 5335 including a CPU, a controller and the like are formed. Such module is combined with an input means 5336, a battery 5337 and an antenna 5340, and then incorporated into housings 5339. A pixel portion of the display panel 5301 is disposed so that it can be seen from an open window formed in the housing 5339.

The portable phone in accordance with this embodiment can be changed into various modes in accordance with the function or applications. For example, even when the portable phone is constructed in such a manner that multiple display panels are used and a housing is appropriately divided into multiple units so as to enable folding/unfolding with a hinge, the number of transistors for the gate signal line driver circuit and the source signal line driver circuit on the display panel can be drastically reduced. Therefore, such effects can be obtained that the layout area of a driver circuit portion around the pixel portion can be reduced as well as a high-yield product can be provided to customers.

By applying the invention to the portable phone shown in FIG. 20(A), FIG. 20(B) and FIG. 21, the number of transistors for the gate signal line driver circuit and the source signal line driver circuit on the display panel can be drastically reduced; therefore, the layout area of a driver circuit portion around the pixel portion can be reduced as well as a high-yield product can be provided to customers.

Figure 22A:
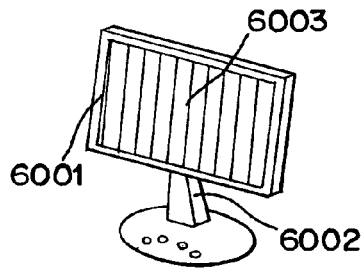
FIGS. 22(a)-22(e) are views showing examples of an electronic apparatus to which the invention is applied.

FIG. 22(A) is a liquid crystal display constructed of a housing 6001, a support base 6002, a display portion 6003 and the like. The invention can be applied to a driver circuit of the display portion 6003 by using the liquid crystal module shown in FIG. 13 and the structure of the display panel shown in FIG. 20(A).

By using the invention, the number of transistors for a gate signal line driver circuit and a source signal line driver circuit in the display portion 6003 can be drastically reduced; therefore, the layout area of a driver circuit portion around the pixel portion can be reduced as well as a high-yield product can be provided to customers.

Figure 22B:
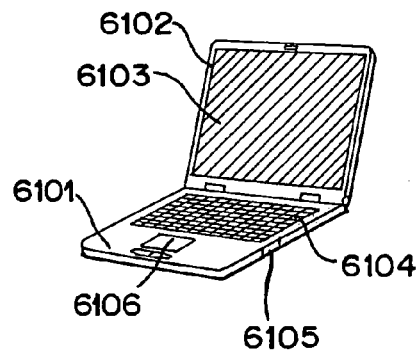

FIG. 22(B) is a computer including a main body 6101, a housing 6102, a display portion 6103, a keyboard 6104, an external connecting port 6105, a pointing mouse 6106 and the like. The invention can be applied to the display portion 6103 by using the liquid crystal module shown in FIG. 13 and the structure of the display panel shown in FIG. 20(A).

By using the invention, the number of transistors for a gate signal line driver circuit and a source signal line driver circuit in the display portion 6103 can be drastically reduced; therefore, the layout area of a driver circuit portion around the pixel portion can be reduced as well as a high-yield product can be provided to customers.

Figure 22C:
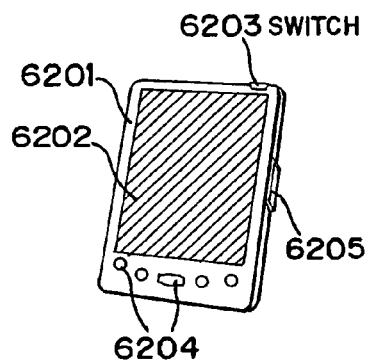

FIG. 22(C) is a portable computer including a main body 6201, a display portion 6202, a switch 6203, operating keys 6204, an IR port 6205 and the like. The invention can be applied to the display portion 6202 by using the liquid crystal module shown in FIG. 13 and the structure of the display panel shown in FIG. 20(A).

By using the invention, the number of transistors for a gate signal line driver circuit and a source signal line driver circuit in the display portion 6202 can be drastically reduced; therefore, the layout area of a driver circuit portion around the pixel portion can be reduced as well as a high-yield product can be provided to customers.

Figure 22D:
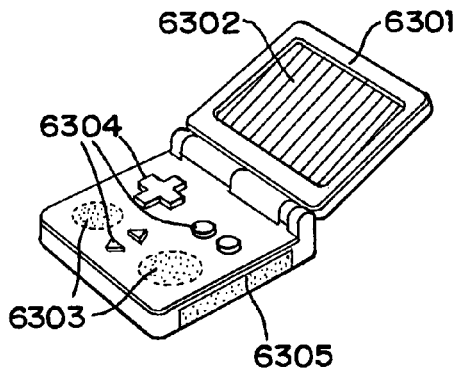

FIG. 22(D) is a portable game machine including a housing 6301, a display portion 6302, speaker portions 6303, operating keys 6304, a recording-medium insert socket 6305 and the like. The invention can be applied to the display portion 6302 by using the liquid crystal module shown in FIG. 13 and the structure of the display panel shown in FIG. 20(A).

By using the invention, the number of transistors for a gate signal line driver circuit and a source signal line driver circuit in the display portion 6302 can be drastically reduced; therefore, the layout area of a driver circuit portion around the pixel portion can be reduced as well as a high-yield product can be provided to customers.

Figure 22E:
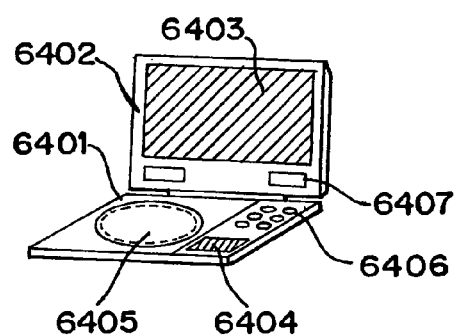
Figure 23:
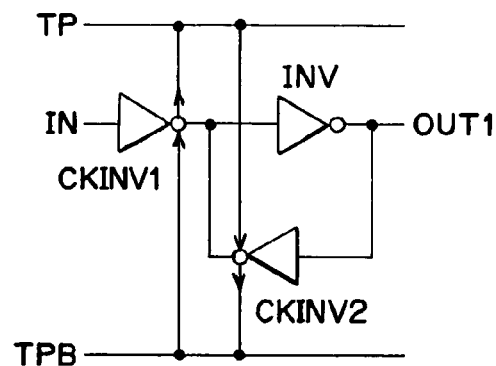
FIG. 23 is a circuit diagram showing a configuration of a conventional example.
Figure 24:
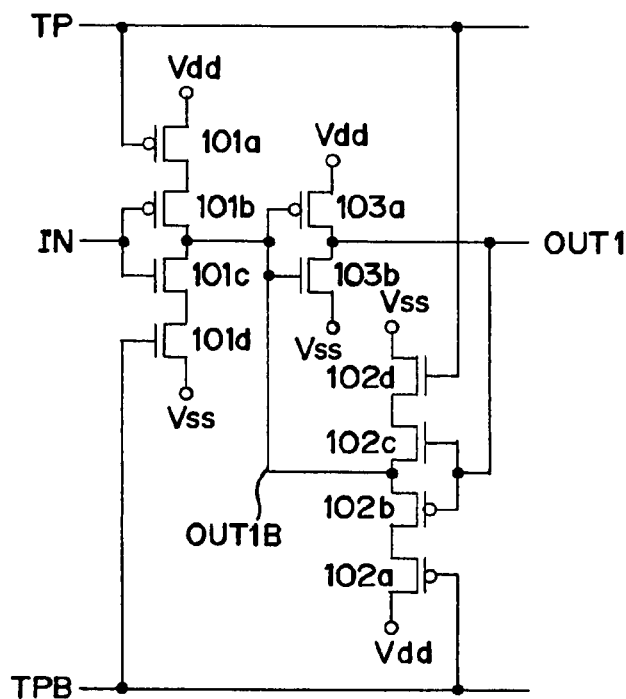
FIG. 24 is a circuit diagram showing a configuration of a conventional example.

FIG. 22(E) is a portable image reproducing device provided with a recording medium (specifically, a DVD reproducing device) including a main body 6401, a housing 6402, a display portion A6403, a display portion B6404, a recording medium (such as a DVD) reading portion 6405, an operating key 6406, a speaker portion 6407 and the like. The display portion A6403 mainly displays image data, and the display portion B6404 mainly displays text data. The invention can be applied to the display portion A6403, the display portion B6404, the control circuit portion and the like by using the liquid crystal module shown in FIG. 13 and the structure of the display panel shown in FIG. 20(A). Note that the image reproducing device provided with a recording medium includes a home game machine and the like.

By using the invention, the number of transistors for a gate signal line driver circuit and a source signal line driver circuit in the display portion A6403 and the display portion B6404 can be drastically reduced; therefore, the layout area of a driver circuit portion around the pixel portion can be reduced as well as a high-yield product can be provided to customers.

Display devices used in such electronic apparatuses can be formed by using not only a glass substrate but also a heat-resistant plastic substrate in accordance with the size, strength or applications. Accordingly, even more reduction in weight can be achieved.

Note that examples shown in this embodiment are only exemplary, and therefore, the invention is not limited to such applications.

This embodiment can be freely implemented in combination with any of the aforementioned embodiment mode and embodiments.

The invention claimed is:

1. A semiconductor circuit comprising: a first n-channel transistor, a first p-channel transistor, a second n-channel transistor, a second p-channel transistor, and an inverter circuit, comprising:
a gate terminal of the first n-channel transistor and a gate terminal of the first p-channel transistor to which a first input signal is inputted;
a first terminal of the first n-channel transistor to which a timing control signal is inputted;
a first terminal of the first p-channel transistor to which an inverted timing control signal is inputted;
a second terminal of the first n-channel transistor, and a second terminal of the first p-channel transistor electrically connected to the second terminal of the first n-channel transistor;
wherein the second terminal of the first n-channel transistor and the second terminal of the first p-channel transistor are electrically connected to an input terminal of the inverter circuit;
a gate terminal of the second n-channel transistor and a gate terminal of the second p-channel transistor to which a second signal that is outputted from an output terminal of the inverter circuit is inputted;
a first terminal of the second p-channel transistor which the timing control signal is inputted;
a first terminal of the second n-channel transistor which the inverted timing control signal is inputted;
a second terminal of the second n-channel transistor, and a second terminal of the second p-channel transistor electrically connected to the second terminal of the second n-channel transistor; and
wherein the second terminal of the second n-channel transistor and the second terminal of the second p-channel transistor are electrically connected to the input terminal of the inverter circuit.

2. The semiconductor circuit according to claim 1, wherein the timing control circuit is a latch signal, and the inverted timing control circuit is an inverted latch signal.

3. The semiconductor circuit according to claim 1, wherein the n-channel transistors and the p-channel transistors comprises thin film transistors formed over a glass substrate.

4. The semiconductor circuit according to claim 1, wherein the n-channel transistors and the p-channel transistors are formed over a single crystalline substrate.

5. A semiconductor circuit comprising: a first n-channel transistor, a first p-channel transistor, a second n-channel transistor, a second p-channel transistor, and an inverter circuit, comprising:
wherein a gate terminal of the first n-channel transistor and a gate terminal of the first p-channel transistor to which a first input signal is inputted;
a first terminal of the first p-channel transistor to which a timing control signal is inputted;
a first terminal of the first n-channel transistor to which an inverted timing control signal is inputted;
a second terminal of the first n-channel transistor, and a second terminal of the first p-channel transistor electrically connected to the second terminal of the first n-channel transistor;
wherein the second terminal of the first n-channel transistor and the second terminal of the first p-channel transistor are electrically connected to an input terminal of the inverter circuit;
a gate terminal of the second n-channel transistor and a gate terminal of the second p-channel transistor to which a second signal that is outputted from an output terminal of the inverter circuit is inputted;
a first terminal of the second n-channel transistor to which the timing control signal is inputted;
a first terminal of the second p-channel transistor to which the inverted timing control signal is inputted;
wherein second terminals of the second n-channel transistor and the second p-channel transistor electrically connected to each other; and wherein the second terminals of the second n-channel transistor and the second p-channel transistor are electrically connected to the input terminal of the inverter circuit.

6. The semiconductor circuit according to claim 5, wherein the timing control circuit is a clock signal, and the inverted timing control circuit is an inverted clock signal.

7. The semiconductor circuit according to claim 5, wherein the n-channel transistors and the p-channel transistors comprises thin film transistors formed over a glass substrate.

8. The semiconductor circuit according to claim 5, wherein that the n-channel transistors and the p-channel transistors are formed over a single crystalline substrate.

9. A semiconductor circuit comprising: a first n-channel transistor, a first p-channel transistor, a second n-channel transistor, a second p-channel transistor, a first inverter circuit, a third n-channel transistor, a third p-channel transistor, a fourth n-channel transistor, a fourth p-channel transistor, and a second inverter circuit, comprising:
- a gate terminal of the first n-channel transistor and a gate terminal of the first p-channel transistor to which a first input signal is inputted;
- a first terminal of the first n-channel transistor to which a clock signal is inputted;
- a first terminal of the first p-channel transistor to which an inverted clock signal is inputted;
- a second terminal of the first n-channel transistor, and a second terminal of the first p-channel transistor electrically connected to the second terminal of the first n-channel transistor;
- wherein the second terminal of the first n-channel transistor and the second terminal of the first p-channel transistor are electrically connected to an input terminal of the first inverter circuit;
- a gate terminal of the second n-channel transistor and a gate terminal of the second p-channel transistor to which a second signal that is outputted from an output terminal of the first inverter circuit is inputted;
- a first terminal of the second p-channel transistor to which the clock signal is inputted;
- a first terminal of the second n-channel transistor to which the inverted clock signal is inputted;
- a second terminal of the second n-channel transistor, and a second terminal of the second p-channel transistor electrically connected to the second terminal of the second n-channel transistor;
- wherein the second terminals of the second n-channel transistor and the second p-channel transistor are electrically connected to the input terminal of the first inverter circuit;
- a gate terminal of the third n-channel transistor and a gate terminal of the third p-channel transistor to which the second input signal is inputted;
- a first terminal of the third p-channel transistor to which the clock signal is inputted;
- a first terminal of the third n-channel transistor to which the inverted clock signal is inputted;
- a second terminal of the third n-channel transistor, the second terminal of the third n-channel transistor, and a second terminal of the third p-channel transistor;
- wherein the second terminal of the third n-channel transistor and the second terminal of the third p-channel transistor are electrically connected to an input terminal of the second inverter circuit;
- a gate terminal of the fourth n-channel transistor and a gate terminal of the fourth p-channel transistor to which a third signal that is outputted from an output terminal of the second inverter circuit is inputted;
- a first terminal of the fourth n-channel transistor to which the clock signal is inputted;
- a first terminal of the fourth p-channel transistor to which the inverted clock signal is inputted;
- a second terminal of the fourth n-channel transistor, and a second terminal of the fourth p-channel transistor electrically connected to the second terminal of the fourth n-channel transistor; and
- wherein the second terminals of the fourth n-channel transistor and the fourth p-channel transistor are electrically connected to the input terminal of the second inverter circuit.

10. The semiconductor circuit according to claim 9, wherein the n-channel transistors and the p-channel transistors comprises thin film transistors formed over a glass substrate.

11. The semiconductor circuit according to claim 9, wherein that the n-channel transistors and the p-channel transistors are formed over a single crystalline substrate.

12. A semiconductor circuit comprising: a first n-channel transistor, a first p-channel transistor, a second n-channel transistor, a second p-channel transistor, a first inverter circuit, a third n-channel transistor, a third p-channel transistor, a fourth n-channel transistor, a fourth p-channel transistor, and a second inverter circuit, comprising
- a gate terminal of the first n-channel transistor and a gate terminal of the first p-channel transistor to which a first input signal is inputted;
- a first terminal of the first p-channel transistor to which a clock signal is inputted;
- a first terminal of the first n-channel transistor to which an inverted clock signal is inputted;
- a second terminal of the first n-channel transistor, and a second terminal of the first p-channel transistor which is electrically connected to the second terminal of the first n-channel transistor;
- wherein the second terminals of the first n-channel transistor and the first p-channel transistor are electrically connected to an input terminal of the first inverter circuit;
- wherein a gate terminal of the second n-channel transistor and a gate terminal of the second p-channel transistor to which a second signal that is outputted from an output terminal of the first inverter circuit is inputted;
- a first terminal of the second n-channel transistor to which the clock signal is inputted;
- a first terminal of the second p-channel transistor to which the inverted clock signal is inputted;
- a second terminal of the second n-channel transistor, and a second terminal of the second p-channel transistor which is electrically connected to the second terminal of the second n-channel transistor;
- wherein the second terminal of the second n-channel transistor and the second terminal of the second p-channel transistor are electrically connected to the input terminal of the first inverter circuit;
- a gate terminal of the third n-channel transistor and a gate terminal of the third p-channel transistor to which the second input signal is inputted;
- a first terminal of the third n-channel transistor to which a clock signal is inputted;
- a first terminal of the third p-channel transistor to which an inverted clock signal is inputted;

a second terminal of the third n-channel transistor, and a second terminal of the third p-channel transistor which is electrically connected to the second terminal of the third n-channel transistor;

wherein the second terminals of the third n-channel transistor and the third p-channel transistor are electrically connected to an input terminal of the second inverter circuit;

a gate terminal of the fourth n-channel transistor and a gate terminal of the fourth p-channel transistor to which a third signal that is outputted from an output terminal of the second inverter circuit is inputted;

a first terminal of the fourth p-channel transistor to which the clock signal is inputted;

a first terminal of the fourth n-channel transistor to which the inverted clock signal is inputted;

a second terminal of the fourth n-channel transistor, and a second terminal of the fourth p-channel transistor which is electrically connected to the second terminal of the fourth n-channel transistor; and wherein the second terminals of the fourth n-channel transistor and the fourth p-channel transistor are electrically connected to the input terminal of the second inverter circuit.

13. The semiconductor circuit according to claim 12, characterized in that the n-channel transistors and the p-channel transistors comprises thin film transistors formed over a glass substrate.

14. The semiconductor circuit according to claim 12, wherein the n-channel transistors and the p-channel transistors are formed over a single crystalline substrate.

15. A display device by comprising: a gate driver, a source driver, and a pixel portion connected to the gate driver and the source driver, wherein the source driver includes a shift register circuit and a latch circuit;

wherein the gate driver includes a shift register circuit;

wherein each of the shift register circuit and the latch circuit of the source driver and the shift register circuit of the gate driver has a semiconductor circuit comprising a first n-channel transistor, a first p-channel transistor, a second n-channel transistor, a second p-channel transistor, and an inverter circuit; and wherein the semiconductor circuit comprises:
a gate terminal of the first n-channel transistor and a gate terminal of the first p-channel transistor to which a first input signal is inputted;
a first terminal of the first n-channel transistor to which a timing control signal is inputted;
a first terminal of the first p-channel transistor to which an inverted timing control signal is inputted;
a second terminal of the first n-channel transistor, and a second terminal of the first p-channel transistor which is electrically connected to the second terminal of the first n-channel transistor;
wherein the second terminals of the first n-channel transistor and the first p-channel transistor are electrically connected to an input terminal of the inverter circuit;
a gate terminal of the second n-channel transistor and a gate terminal of the second p-channel transistor to which a second signal that is outputted from an output terminal of the inverter circuit is inputted;
a first terminal of the second p-channel transistor to which the timing control signal is inputted;
a first terminal of the second n-channel transistor to which the inverted timing control signal is inputted;
a second terminal of the second n-channel transistor, and a second terminal of the second p-channel transistor which is electrically connected to the second terminal of the second n-channel transistor; and
wherein the second terminal of the second n-channel transistor and the second terminal of the second p-channel transistor are electrically connected to the input terminal of the inverter circuit.

16. The display device according to claim 15, wherein the n-channel transistors and the p-channel transistors are formed over a glass substrate.

17. The display device according to claim 15, wherein the n-channel transistors and the p-channel transistors are formed over a single crystalline substrate.

18. The display device according to claim 15, further comprising a liquid crystal element or an OLED element.

19. A display device comprising: a gate driver, a source driver, and a pixel portion connected to the gate driver and the source driver, wherein the source driver includes a shift register circuit and a latch circuit;

wherein the gate driver includes a shift register circuit;

wherein each of the shift register circuit of the source driver and the shift register circuit of the gate driver has a semiconductor circuit having a first n-channel transistor, a first p-channel transistor, a second n-channel transistor, a second p-channel transistor, and an inverter circuit; and wherein the semiconductor circuit comprises:
a gate terminal of the first n-channel transistor and a gate terminal of the first p-channel transistor to which a first input signal is inputted;
a first terminal of the first p-channel transistor to which a timing control signal is inputted;
a first terminal of the first n-channel transistor to which an inverted timing control signal is inputted;
a second terminal of the first n-channel transistor, and a second terminal of the first p-channel transistor which is electrically connected to the second terminal of the first n-channel transistor;
wherein the second terminal of the first n-channel transistor and the second terminal of the first p-channel transistor are electrically connected to an input terminal of the inverter circuit;
a gate terminal of the second n-channel transistor and a gate terminal of the second p-channel transistor to which a second signal that is outputted from an output terminal of the inverter circuit is inputted;
a first terminal of the second n-channel transistor to which the timing control signal is inputted;
a first terminal of the second p-channel transistor to which the inverted timing control signal is inputted;
a second terminal of the second n-channel transistor, and a second terminal of the second p-channel transistor which is electrically connected to the second terminal of the second n-channel transistor; and
wherein the second terminal of the second n-channel transistor and the second terminal of the second p-channel transistor are electrically connected to the input terminal of the inverter circuit.

20. The display device according to claim 19, wherein the n-channel transistors and the p-channel transistors are formed over a glass substrate.

21. The display device according to claim 19, wherein the n-channel transistors and the p-channel transistors are formed over a single crystalline substrate.

22. The display device according to claim 19, further comprising a liquid crystal element or an OLED element.

23. A display device comprising: a gate driver, a source driver, and a pixel portion connected to the gate driver and the source driver,
wherein the source driver includes a shift register circuit and a latch circuit;
wherein the gate driver includes a shift register circuit;
wherein each of the shift register circuit of the source driver and the shift register circuit of the gate driver has multiple semiconductor circuits each having a first n-channel transistor, a first p-channel transistor, a second n-channel transistor, a second p-channel transistor, a first inverter circuit, a third n-channel transistor, a third p-channel transistor, a fourth n-channel transistor, a fourth p-channel transistor, and a second inverter circuit; and
wherein each of the semiconductor circuits comprises:
a gate terminal of the second n-channel transistor and a gate terminal of the second p-channel transistor to which a second signal that is outputted from an output terminal of the first inverter circuit is inputted;
a first terminal of the second p-channel transistor to which the clock signal is inputted;
a first terminal of the second n-channel transistor to which the inverted clock signal is inputted;
a second terminal of the second n-channel transistor, and a second terminal of the second p-channel transistor electrically connected to the second terminal of the second n-channel transistor;
wherein the second terminal of the second n-channel transistor and the second terminal of the second p-channel transistor are electrically connected to an input terminal of the first inverter circuit;
a gate terminal of the third n-channel transistor and a gate terminal of the third p-channel transistor to which the second input signal is inputted;
a first terminal of the third p-channel transistor to which a clock signal is inputted;
a first terminal of the third n-channel transistor to which a inverted clock signal is inputted;
a first terminal of the third n-channel transistor, and a second terminal of the third p-channel transistor which is electrically connected to the second terminal of the third n-channel transistor;
wherein the second terminal of the third n-channel transistor and the second terminal of the third p-channel transistor are electrically connected to an input terminal of the second inverter circuit;
a gate terminal of the fourth n-channel transistor and a gate terminal of the fourth p-channel transistor to which a third signal that is outputted from an output terminal of the second inverter circuit is inputted;
a first terminal of the fourth n-channel transistor to which the clock signal is inputted;
a first terminal of the fourth p-channel transistor to which the inverted clock signal is inputted;
a second terminal of the fourth n-channel transistor, and a second terminal of the fourth p-channel transistor which is electrically connected to the second terminal of the fourth n-channel transistor; and
wherein the second terminal of the fourth n-channel transistor and the second terminal of the fourth p-channel transistor are electrically connected to the input terminal of the second inverter circuit.

24. The display device according to claim 23, wherein the n-channel transistors and the p-channel transistors are thin film transistors formed over a glass substrate.

25. The display device according to claim 23, wherein that the n-channel transistors and the p-channel transistors are formed over a single crystalline substrate.

26. The display device according to claim 23, further comprising a liquid crystal element or an OLED element.

27. A display device comprising: a gate driver, a source driver, and a pixel portion connected to the gate driver and the source driver;
wherein the source driver includes a shift register circuit and a latch circuit;
wherein the gate driver includes a shift register circuit;
wherein each of the shift register circuit of the source driver and the shift register circuit of the gate driver has multiple semiconductor circuits each having a first n-channel transistor, a first p-channel transistor, a second n-channel transistor, a second p-channel transistor, a first inverter circuit, a third n-channel transistor, a third p-channel transistor, a fourth n-channel transistor, a fourth p-channel transistor, and a second inverter circuit; and
wherein each of the semiconductor circuits comprises:
a gate terminal of the first n-channel transistor and a gate terminal of the first p-channel transistor to which a first input signal is inputted;
a first terminal of the first p-channel transistor to which a clock signal is inputted;
a first terminal of the first n-channel transistor to which an inverted clock signal is inputted;
a second terminal of the first n-channel transistor, and a second terminal of the first p-channel transistor which is electrically connected to the second terminal of the first n-channel transistor;
wherein the second terminal of the first n-channel transistor and the second terminal of the first p-channel transistor are electrically connected to an input terminal of the first inverter circuit;
a gate terminal of the second n-channel transistor and a gate terminal of the second p-channel transistor to which a second signal that is outputted from an output terminal of the first inverter circuit is inputted;
a first terminal of the second n-channel transistor to which the clock signal is inputted;
a first terminal of the second p-channel transistor to which the inverted clock signal is inputted;
a second terminal of the second n-channel transistor, and a second terminal of the second p-channel transistor which is electrically connected to the second terminal of the second n-channel transistor; and
wherein the second terminal of the second n-channel transistor and the second terminal of the second p-channel transistor are electrically connected to the input terminal of the first inverter circuit;
a gate terminal of the third n-channel transistor and a gate terminal of the third p-channel transistor to which the second input signal is inputted;
a first terminal of the third n-channel transistor to which a clock signal is inputted;
a first terminal of the third p-channel transistor to which the inverted clock signal is inputted;
a second terminal of the third n-channel transistor, and a second terminal of the third p-channel transistor which is electrically connected to the second terminal of the third n-channel transistor;

wherein the second terminal of the third n-channel transistor and the second terminal of the third p-channel transistor are electrically connected to an input terminal of the second inverter circuit;

a gate terminal of the fourth n-channel transistor and a gate terminal of the fourth p-channel transistor to which a third signal that is outputted from an output terminal of the second inverter circuit is inputted;

a first terminal of the fourth p-channel transistor to which the clock signal is inputted;

a first terminal of the fourth n-channel transistor to which the inverted clock signal is inputted;

a second terminal of the fourth n-channel transistor, and a second terminal of the fourth p-channel transistor which is electrically connected to the second terminal of the fourth n-channel transistor; and wherein the second terminal of the fourth n-channel transistor and the second terminal of the p-channel transistor are electrically connected to the input terminal of the second inverter circuit.

28. The display device according to claim 27, wherein the n-channel transistors and the p-channel transistors are thin film transistors formed over a glass substrate.

29. The display device according to claim 27, wherein that the n-channel transistors and the p-channel transistors are formed over a single crystalline substrate.

30. The display device according to claim 27, further comprising a liquid crystal element or an OLED element.

31. An electronic apparatus comprising a display panel including: a gate driver, a source driver, and a pixel portion connected to the gate driver and the source driver, wherein the source driver includes a shift register circuit and a latch circuit;

wherein the gate driver includes a shift register circuit;

wherein each of the shift register circuit and the latch circuit of the source driver and the shift register circuit of the gate driver has a semiconductor circuit having a first n-channel transistor, a first p-channel transistor, a second n-channel transistor, a second p-channel transistor, and an inverter circuit; and wherein the semiconductor circuit comprises:
 a gate terminal of the first n-channel transistor and a gate terminal of the first p-channel transistor to which a first input signal is inputted;
 a first terminal of the first n-channel transistor to which a timing control signal is inputted;
 a first terminal of the first p-channel transistor to which an inverted timing control signal is inputted;
 a second terminal of the first n-channel transistor, and a second terminal of the first p-channel transistor which is electrically connected to the second terminal of the first n-channel transistor;
 wherein the second terminal of the first n-channel transistor and the second terminal of the first p-channel transistor are electrically connected to an input terminal of the inverter circuit;
 a gate terminal of the second n-channel transistor and a gate terminal of the second p-channel transistor to which a second signal that is outputted from an output terminal of the inverter circuit is inputted;
 a first terminal of the second p-channel transistor to which the timing control signal is inputted;
 a first terminal of the second n-channel transistor to which the inverted timing control signal is inputted;
 a second terminal of the second n-channel transistor, and a second terminal of the second p-channel transistor which is electrically connected to the second terminal of the second n-channel transistor; and
 wherein the second terminal of the second n-channel transistor and the second terminal of the second p-channel transistor are electrically connected to the input terminal of the inverter circuit.

32. The electronic apparatus according to claim 31, wherein that the display panel comprises a liquid crystal element or an OLED element.

33. The electronic apparatus according to claim 31, corresponding to a television receiver, a video camera, a digital camera, a goggle display, a navigation system, an audio reproducing device, a computer, a game machine, a mobile computer, a portable phone, a portable game machine, an electronic book, or an image reproducing device.

34. An electronic apparatus comprising a display panel including: a gate driver, a source driver, and a pixel portion connected to the gate driver and the source driver, wherein the source driver includes a shift register circuit and a latch circuit;

wherein the gate driver includes a shift register circuit;

wherein each of the shift register circuit of the source driver and the shift register circuit of the gate driver has a semiconductor circuit having a first n-channel transistor, a first p-channel transistor, a second n-channel transistor, a second p-channel transistor, and an inverter circuit; and wherein the semiconductor circuit comprises:
 a gate terminal of the first n-channel transistor and a gate terminal of the first p-channel transistor to which a first input signal is inputted;
 a first terminal of the first p-channel transistor to which a timing control signal is inputted;
 a first terminal of the first n-channel transistor to which an inverted timing control signal is inputted;
 a second terminal of the first n-channel transistor, and a second terminal of the first p-channel transistor which is electrically connected to the second terminal of the first n-channel transistor;
 wherein the second terminal of the first n-channel transistor and the second terminal of the first p-channel transistor are electrically connected to an input terminal of the inverter circuit;
 a gate terminal of the second n-channel transistor and a gate terminal of the second p-channel transistor to which a second signal that is outputted from an output terminal of the inverter circuit is inputted;
 a first terminal of the second n-channel transistor to which the timing control signal is inputted;
 a first terminal of the second p-channel transistor to which the inverted timing control signal is inputted;
 a second terminal of the second n-channel transistor, and a second terminal of the second p-channel transistor which is electrically connected to the second terminal of the second n-channel transistor; and
 wherein the second terminal of the second n-channel transistor and the second terminal of the second p-channel transistor are electrically connected to the input terminal of the inverter circuit.

35. The electronic apparatus according to claim 34, wherein that the display panel comprises a liquid crystal element or an OLED element.

36. The electronic apparatus according to claim 34, corresponding to a television receiver, a video camera, a digital camera, a goggle display, a navigation system, an audio reproducing device, a computer, a game machine, a mobile computer, a portable phone, a portable game machine, an electronic book, or an image reproducing device.

37. An electronic apparatus comprising a display panel including: a gate driver, a source driver, and a pixel portion connected to the gate driver and the source driver,
wherein the source driver includes a shift register circuit and a latch circuit;
wherein the gate driver includes a shift register circuit;
wherein each of the shift register circuit of the source driver and the shift register circuit included in the gate driver has multiple semiconductor circuits each having a first n-channel transistor, a first p-channel transistor, a second n-channel transistor, a second p-channel transistor, a first inverter circuit, a third n-channel transistor, a third p-channel transistor, a fourth n-channel transistor, a fourth n-channel transistor, and a second inverter circuit; and
wherein each of the semiconductor circuits comprises:
a gate terminal of the first n-channel transistor and a gate terminal of the first p-channel transistor to which a first input signal is inputted;
a first terminal of the first n-channel transistor to which a clock signal is inputted;
a first terminal of the first p-channel transistor to which an inverted clock signal is inputted;
a second terminal of the first n-channel transistor, and a second terminal of the first p-channel transistor which is electrically connected to the second terminal of the first n-channel transistor;
wherein the second terminal of the first n-channel transistor and the second terminal of the first p-channel transistor are electrically connected to an input terminal of the first inverter circuit;
a gate terminal of the second n-channel transistor and a gate terminal of the second p-channel transistor to which a second signal that is outputted from an output terminal of the first inverter circuit is inputted;
a first terminal of the second p-channel transistor to which the clock signal is inputted;
a first terminal of the second n-channel transistor to which the inverted clock signal is inputted;
a second terminal of the second n-channel transistor, and a second terminal of the second p-channel transistor which is electrically connected to the second terminal of the second n-channel transistor;
wherein the second terminal of the second n-channel transistor and the second terminal of the second p-channel transistor are electrically connected to the input terminal of the first inverter circuit;
a gate terminal of the third n-channel transistor and a gate terminal of the third p-channel transistor to which the second input signal is inputted;
a first terminal of the third p-channel transistor to which a clock signal is inputted;
a first terminal of the third n-channel transistor to which a inverted clock signal is inputted;
a second terminal of the third n-channel transistor and a second terminal of the third p-channel transistor electrically connected to each other;
wherein the second terminal of the third n-channel transistor and the second terminal of the third p-channel transistor are electrically connected to an input terminal of the second inverter circuit;
a gate terminal of the fourth n-channel transistor and a gate terminal of the fourth p-channel transistor to which a third signal that is outputted from an output terminal of the second inverter circuit is inputted;

a first terminal of the fourth n-channel transistor to which the clock signal is inputted;
a first terminal of the fourth p-channel transistor to which the inverted clock signal is inputted;
a second terminal of the fourth n-channel transistor, and a second terminal of the fourth p-channel transistor which is electrically connected to the second terminal of the fourth n-channel transistor; and
wherein the second terminal of the fourth n-channel transistor and the second terminal of the fourth p-channel transistor are electrically connected to the input terminal of the second inverter circuit.

38. The electronic apparatus according to claim 37, wherein that the display panel comprises a liquid crystal element or an OLED element.

39. The electronic apparatus according to claim 37, corresponding to a television receiver, a video camera, a digital camera, a goggle display, a navigation system, an audio reproducing device, a computer, a game machine, a mobile computer, a portable phone, a portable game machine, an electronic book, or an image reproducing device.

40. An electronic apparatus comprising a display panel including: a gate driver, a source driver, and a pixel portion connected to the gate driver and the source driver,
wherein the source driver includes a shift register circuit and a latch circuit;
wherein the gate driver includes a shift register circuit;
wherein each of the shift register circuit of the source driver and the shift register circuit of the gate driver has multiple semiconductor circuits each having a first n-channel transistor, a first p-channel transistor, a second n-channel transistor, a second p-channel transistor, a first inverter circuit, a third n-channel transistor, a third p-channel transistor, a fourth n-channel transistor, a fourth n-channel transistor, and a second inverter circuit; and
wherein each of the semiconductor circuits comprises:
a gate terminal of the first n-channel transistor and a gate terminal of the first p-channel transistor to which a first input signal is inputted;
a first terminal of the first p-channel transistor to which a clock signal is inputted;
a first terminal of the first n-channel transistor to which an inverted clock signal is inputted;
a second terminal of the first n-channel transistor, and a second terminal of the first p-channel transistor which is electrically connected to the second terminal of the first n-channel transistor;
wherein the second terminals of the first n-channel transistor and the first p-channel transistor are electrically connected to an input terminal of the first inverter circuit;
a gate terminal of the second n-channel transistor and a gate terminal of the second p-channel transistor to which a second signal that is outputted from an output terminal of the first inverter circuit is inputted;
a first terminal of the second n-channel transistor to which the clock signal is inputted;
a first terminal of the second p-channel transistor to which the inverted clock signal is inputted;
a second terminal of the second n-channel transistor, and a second terminal of the second p-channel transistor which is electrically connected to the second terminal of the second n-channel transistor;
wherein the second terminal of the second n-channel transistor and the second terminal of the second p-channel transistor are electrically connected to the input terminal of the first inverter circuit;

a gate terminal of the third n-channel transistor and a gate terminal of the third p-channel transistor to which the second input signal is inputted;

a first terminal of the third n-channel transistor to which a clock signal is inputted;

a first terminal of the third p-channel transistor to which a inverted clock signal is inputted;

a second terminal of the third n-channel transistor, and a second terminal of the third p-channel transistor electrically connected to the second terminal of the third n-channel transistor;

wherein the second terminal of the third n-channel transistor and the second terminal of the third p-channel transistor are electrically connected to an input terminal of the second inverter circuit;

a gate terminal of the fourth n-channel transistor and a gate terminal of the fourth p-channel transistor to which a third signal that is outputted from an output terminal of the second inverter circuit is inputted;

a first terminal of the fourth p-channel transistor to which the clock signal is inputted;

a first terminal of the fourth n-channel transistor to which the inverted clock signal is inputted;

a second terminal of the fourth n-channel transistor, and a second terminal of the fourth p-channel transistor which is electrically connected to the second terminal of the fourth n-channel transistor; and wherein the second terminal of the fourth n-channel transistor and the second terminal of the fourth p-channel transistor are electrically connected to the input terminal of the second inverter circuit.

41. The electronic apparatus according to claim 40, wherein that the display panel comprises a liquid crystal element or an OLED element.

42. The electronic apparatus according to claim 40, corresponding to a television receiver, a video camera, a digital camera, a goggle display, a navigation system, an audio reproducing device, a computer, a game machine, a mobile computer, a portable phone, a portable game machine, an electronic book, or an image reproducing device.

* * * * *